United States Patent
Chen et al.

(10) Patent No.: US 12,500,572 B2
(45) Date of Patent: Dec. 16, 2025

(54) MULTIPLEXER FORMED ON MULTI-LAYER PIEZOELECTRIC SUBSTRATE AND TEMPERATURE COMPENSATED SURFACE ACOUSTIC WAVE DEVICE DIES

(71) Applicant: Skyworks Solutions, Inc., Irvine, CA (US)

(72) Inventors: Li Chen, Irvine, CA (US); Rei Goto, Osaka (JP)

(73) Assignee: Skyworks Solutions, Inc., Irvine, CA (US)

( * ) Notice: Subject to any disclaimer, the term of this patent is extended or adjusted under 35 U.S.C. 154(b) by 247 days.

(21) Appl. No.: 18/190,459

(22) Filed: Mar. 27, 2023

(65) Prior Publication Data
US 2023/0344416 A1    Oct. 26, 2023

Related U.S. Application Data

(60) Provisional application No. 63/367,024, filed on Jun. 24, 2022, provisional application No. 63/367,020, (Continued)

(51) Int. Cl.
*H03H 9/25* (2006.01)
*H03H 9/02* (2006.01)
(Continued)

(52) U.S. Cl.
CPC .......... *H03H 9/25* (2013.01); *H03H 9/02574* (2013.01); *H03H 9/02834* (2013.01);
(Continued)

(58) Field of Classification Search
CPC .. H03H 9/25; H03H 9/02574; H03H 9/02834; H03H 9/145; H03H 9/14541;
(Continued)

(56) References Cited

U.S. PATENT DOCUMENTS 5,646,584 A   7/1997   Kondratyev et al.
5,895,996 A   4/1999   Takagi et al.
(Continued)

FOREIGN PATENT DOCUMENTS

CN   113098432 A   7/2021
FR   3105894 A1   7/2021
(Continued)

OTHER PUBLICATIONS

Iwamoto et al., "Transverse Modes in I.H.P. SAW Resonator and Their Suppression Method", Murata Manufacturing co., Ltd., (2018).
(Continued)

*Primary Examiner* — John W Poos
(74) *Attorney, Agent, or Firm* — Knobbe, Martens, Olson & Bear, LLP

(57) ABSTRACT

A multiplexer is disclosed. The multiplexer can include a multilayer piezoelectric substrate surface acoustic wave device that includes at least a portion of a transmission filter. The multiplexer can include a temperature compensated surface acoustic wave device that includes at least a portion of a reception filter. The reception filter is electrically connected to the transmission filter.

20 Claims, 17 Drawing Sheets

Related U.S. Application Data filed on Jun. 24, 2022, provisional application No. 63/367,018, filed on Jun. 24, 2022, provisional application No. 63/331,664, filed on Apr. 15, 2022.

(51) Int. Cl.
*H03H 9/145* (2006.01)
*H03H 9/64* (2006.01)
*H03H 9/72* (2006.01)

(52) U.S. Cl.
CPC ........ *H03H 9/145* (2013.01); *H03H 9/14541* (2013.01); *H03H 9/6483* (2013.01); *H03H 9/72* (2013.01); *H03H 9/725* (2013.01)

(58) Field of Classification Search
CPC ........ H03H 9/6483; H03H 9/72; H03H 9/725; H03H 9/6436; H03H 9/6476; H03H 9/706; H03H 9/64; H03H 9/605; H03H 9/1064; H03H 9/02102
See application file for complete search history.

(56) References Cited

U.S. PATENT DOCUMENTS

| | | | |
|---|---|---|---|
| 7,230,512 B1 | 6/2007 | Carpenter et al. | |
| 7,352,104 B2 | 4/2008 | Yamazaki et al. | |
| 7,554,242 B2 | 6/2009 | Aoki et al. | |
| 8,294,331 B2 | 10/2012 | Abbott et al. | |
| 8,741,683 B2 | 6/2014 | Huang et al. | |
| 9,065,424 B2 | 6/2015 | Nakanishi et al. | |
| 9,124,240 B2 | 9/2015 | Shimizu et al. | |
| 9,136,458 B2 | 9/2015 | Komatsu et al. | |
| 9,257,960 B2 | 2/2016 | Ruile et al. | |
| 9,413,330 B2 | 8/2016 | Shimizu et al. | |
| 9,419,584 B2 | 8/2016 | Tsurunari et al. | |
| 9,438,201 B2 | 9/2016 | Hori et al. | |
| 9,537,464 B2 | 1/2017 | Yamanaka | |
| 9,640,750 B2 | 5/2017 | Nakanishi et al. | |
| 9,641,152 B2 | 5/2017 | Nakamura et al. | |
| 9,673,779 B2 | 6/2017 | Ruile et al. | |
| 9,748,923 B2 | 8/2017 | Kando et al. | |
| 9,748,924 B2 | 8/2017 | Komatsu et al. | |
| 10,090,825 B2 | 10/2018 | Kuroyanagi | |
| 10,153,748 B2 | 12/2018 | Tanaka | |
| 10,361,678 B2 | 7/2019 | Iwaki et al. | |
| 10,476,470 B2 | 11/2019 | Takamine | |
| 10,483,942 B2 * | 11/2019 | Goto | H03H 9/6483 |
| 10,574,207 B2 | 2/2020 | Yoon et al. | |
| 10,727,844 B1 | 7/2020 | Gong et al. | |
| 10,749,497 B2 | 8/2020 | Tang et al. | |
| 10,826,507 B1 | 11/2020 | Gong et al. | |
| 10,873,313 B2 | 12/2020 | Zou et al. | |
| 11,050,406 B2 | 6/2021 | Maki et al. | |
| 11,095,266 B2 | 8/2021 | Inoue et al. | |
| 11,165,411 B2 | 11/2021 | Liu et al. | |
| 11,239,817 B2 | 2/2022 | Hatano | |
| 11,245,378 B2 | 2/2022 | Tang et al. | |
| 11,296,672 B2 | 4/2022 | Hiratsuka et al. | |
| 11,368,137 B2 | 6/2022 | Goto et al. | |
| 11,522,514 B2 | 12/2022 | Zou et al. | |
| 11,606,078 B2 | 3/2023 | Tang et al. | |
| 11,616,491 B2 | 3/2023 | Tang et al. | |
| 11,677,380 B2 | 6/2023 | Fujiwara et al. | |
| 11,722,122 B2 | 8/2023 | Goto et al. | |
| 11,750,172 B2 | 9/2023 | Goto et al. | |
| 11,824,515 B2 | 11/2023 | Tang et al. | |
| 11,962,283 B2 | 4/2024 | Zou et al. | |
| 12,040,784 B2 | 7/2024 | Tang et al. | |
| 12,047,053 B2 | 7/2024 | Maki et al. | |
| 2004/0222717 A1 | 11/2004 | Matsuda et al. | |
| 2005/0077982 A1 | 4/2005 | Funasaka | |
| 2008/0018417 A1 | 1/2008 | Igaki et al. | |
| 2010/0265010 A1 | 10/2010 | Jian | |
| 2012/0049968 A1 | 3/2012 | Owaki et al. | |
| 2014/0285287 A1 | 9/2014 | Komatsu et al. | |
| 2014/0339957 A1 | 11/2014 | Tajima et al. | |
| 2016/0294361 A1 | 10/2016 | Yamane et al. | |
| 2017/0063332 A1 | 3/2017 | Gilbert et al. | |
| 2017/0099043 A1 * | 4/2017 | Goto | H03H 9/725 |
| 2017/0104470 A1 | 4/2017 | Koelle et al. | |
| 2017/0214385 A1 | 7/2017 | Bhattacharjee | |
| 2017/0214386 A1 | 7/2017 | Kido | |
| 2017/0222618 A1 | 8/2017 | Inoue et al. | |
| 2017/0250669 A1 | 8/2017 | Kuroyanagi et al. | |
| 2017/0272051 A1 | 9/2017 | Kurihara et al. | |
| 2017/0273183 A1 | 9/2017 | Kawasaki et al. | |
| 2017/0288629 A1 | 10/2017 | Bhattacharjee et al. | |
| 2017/0359048 A1 | 12/2017 | Yasuda | |
| 2018/0013404 A1 | 1/2018 | Kawasaki et al. | |
| 2018/0048290 A1 | 2/2018 | Sekine et al. | |
| 2018/0097501 A1 | 4/2018 | Kikuchi et al. | |
| 2018/0097508 A1 | 4/2018 | Iwamoto et al. | |
| 2018/0138893 A1 | 5/2018 | Caron | |
| 2018/0316093 A1 | 11/2018 | Guenard et al. | |
| 2018/0367119 A1 | 12/2018 | Lee | |
| 2019/0288661 A1 | 9/2019 | Akiyama et al. | |
| 2019/0319772 A1 | 10/2019 | Ando et al. | |
| 2019/0379347 A1 | 12/2019 | Goto et al. | |
| 2020/0036362 A1 | 1/2020 | Daimon | |
| 2020/0067482 A1 | 2/2020 | Maki et al. | |
| 2020/0106420 A1 | 4/2020 | Kodama et al. | |
| 2020/0144984 A1 | 5/2020 | Fukuhara et al. | |
| 2020/0212875 A1 | 7/2020 | Goto et al. | |
| 2020/0212883 A1 | 7/2020 | Goto et al. | |
| 2020/0220522 A1 | 7/2020 | Nosaka | |
| 2020/0358424 A1 * | 11/2020 | Kaneda | H03H 9/14544 |
| 2020/0366268 A1 | 11/2020 | Goto et al. | |
| 2020/0366270 A1 | 11/2020 | Matsuoka | |
| 2020/0389151 A1 | 12/2020 | Goto | |
| 2021/0050842 A1 | 2/2021 | Tang et al. | |
| 2021/0058057 A1 | 2/2021 | Goto et al. | |
| 2021/0126616 A1 | 4/2021 | Hiramatsu et al. | |
| 2021/0167748 A1 | 6/2021 | Huck et al. | |
| 2021/0297060 A1 | 9/2021 | Omura et al. | |
| 2022/0014152 A1 | 1/2022 | Gebeyehu et al. | |
| 2022/0014175 A1 | 1/2022 | Nagatomo et al. | |
| 2022/0077840 A1 | 3/2022 | Caron | |
| 2022/0109419 A1 | 4/2022 | Esquius Morote | |
| 2022/0209738 A1 | 6/2022 | Torazawa et al. | |
| 2022/0271730 A1 | 8/2022 | Abbott et al. | |
| 2022/0271733 A1 | 8/2022 | Abbott et al. | |
| 2022/0271734 A1 | 8/2022 | Abbott et al. | |
| 2022/0328980 A1 | 10/2022 | Dicarlo et al. | |
| 2022/0360249 A1 | 11/2022 | Ballandras et al. | |
| 2022/0399867 A1 | 12/2022 | Goto et al. | |
| 2022/0399871 A1 | 12/2022 | Goto et al. | |
| 2023/0013597 A1 | 1/2023 | Goto et al. | |
| 2023/0016884 A1 | 1/2023 | Goto et al. | |
| 2023/0026465 A1 | 1/2023 | Huang et al. | |
| 2023/0031568 A1 | 2/2023 | Tang et al. | |
| 2023/0032325 A1 | 2/2023 | Goto et al. | |
| 2023/0039507 A1 | 2/2023 | Kim et al. | |
| 2023/0104405 A1 | 4/2023 | Hiramatsu et al. | |
| 2023/0105726 A1 | 4/2023 | Tang et al. | |
| 2023/0107376 A1 | 4/2023 | Goto et al. | |
| 2023/0109106 A1 | 4/2023 | Hiramatsu et al. | |
| 2023/0112677 A1 | 4/2023 | Tang et al. | |
| 2023/0163748 A1 | 5/2023 | Goto et al. | |
| 2023/0208385 A1 | 6/2023 | Hiramatsu et al. | |
| 2023/0208396 A1 | 6/2023 | Hiramatsu et al. | |
| 2023/0208398 A1 | 6/2023 | Goto et al. | |
| 2023/0208399 A1 | 6/2023 | Goto et al. | |
| 2023/0223910 A1 | 7/2023 | Goto et al. | |
| 2023/0223917 A1 | 7/2023 | Goto et al. | |
| 2023/0231529 A1 | 7/2023 | Hiramatsu et al. | |
| 2023/0275565 A1 | 8/2023 | Tang et al. | |
| 2023/0283261 A1 | 9/2023 | Huang et al. | |
| 2023/0327630 A1 | 10/2023 | Goto et al. | |
| 2023/0327642 A1 | 10/2023 | Goto et al. | |
| 2023/0327645 A1 | 10/2023 | Goto et al. | |
| 2023/0336152 A1 | 10/2023 | Goto et al. | |
| 2023/0336153 A1 | 10/2023 | Goto et al. | |
| 2023/0336159 A1 | 10/2023 | Hiramatsu et al. | |

(56) References Cited

U.S. PATENT DOCUMENTS

| | | |
|---|---|---|
| 2023/0344411 A1 | 10/2023 | Chen et al. |
| 2023/0344415 A1 | 10/2023 | Chen et al. |
| 2024/0022164 A1 | 1/2024 | Gong et al. |
| 2024/0039507 A1 | 2/2024 | Goto et al. |
| 2024/0186978 A1 | 6/2024 | Hiramatsu et al. |
| 2024/0223149 A1 | 7/2024 | Goto et al. |
| 2024/0223152 A1 | 7/2024 | Goto et al. |
| 2024/0223156 A1 | 7/2024 | Goto et al. |

FOREIGN PATENT DOCUMENTS

| | | |
|---|---|---|
| JP | 2009-219045 A | 9/2009 |
| JP | 2014-135624 A | 7/2014 |
| JP | 2020-092422 A | 6/2020 |
| WO | 2017/161303 A1 | 9/2017 |

OTHER PUBLICATIONS

Kapp, M., et al., "Investigation of GeO2 thin film properties for improvement of temperature coefficient of frequency of SAW devices", 2014 European Frequency and Time Forum (EFTF), Jun. 2014, 4 pages.

Solal et al., "A method to reduce losses in buried electrodes Rf Saw resonators," 2011 IEEE International Ultrasonics Symposium, 2011, pp. 324-332, doi: 10.1109/ULTSYM.2011.0078.

* cited by examiner

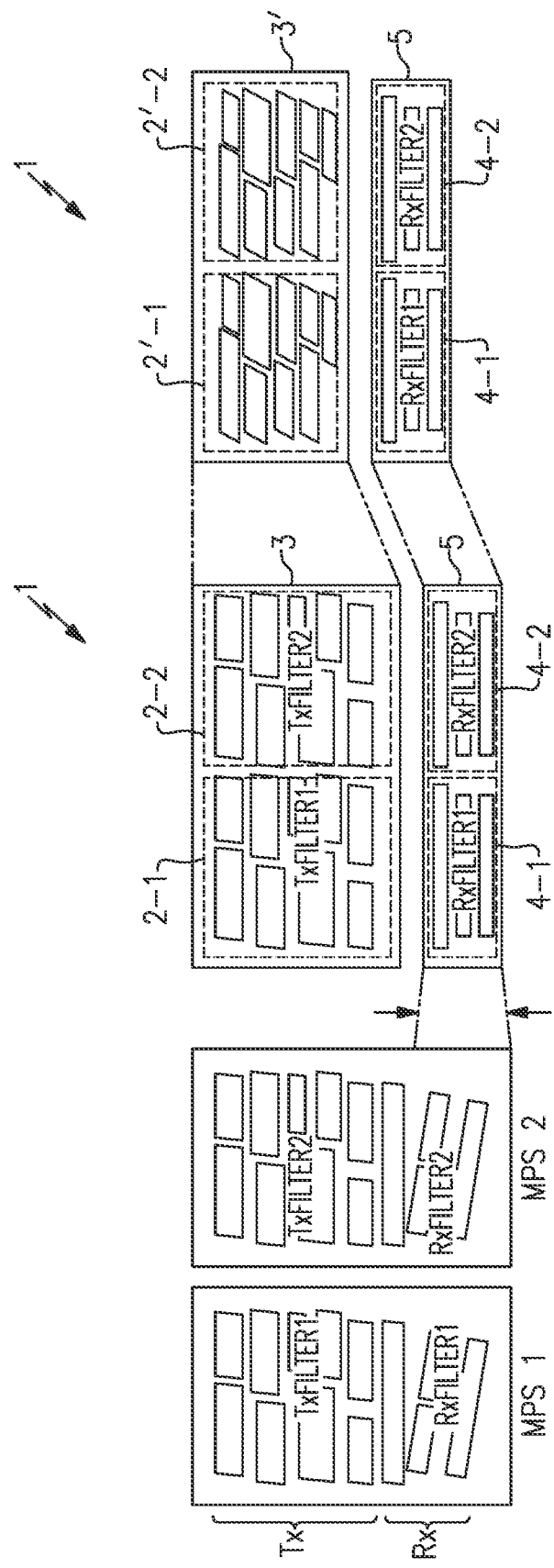

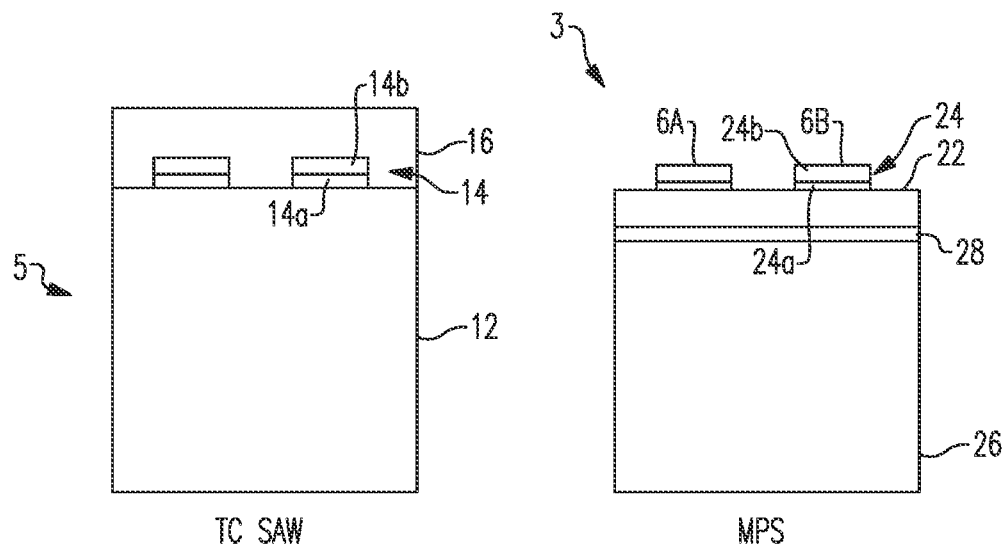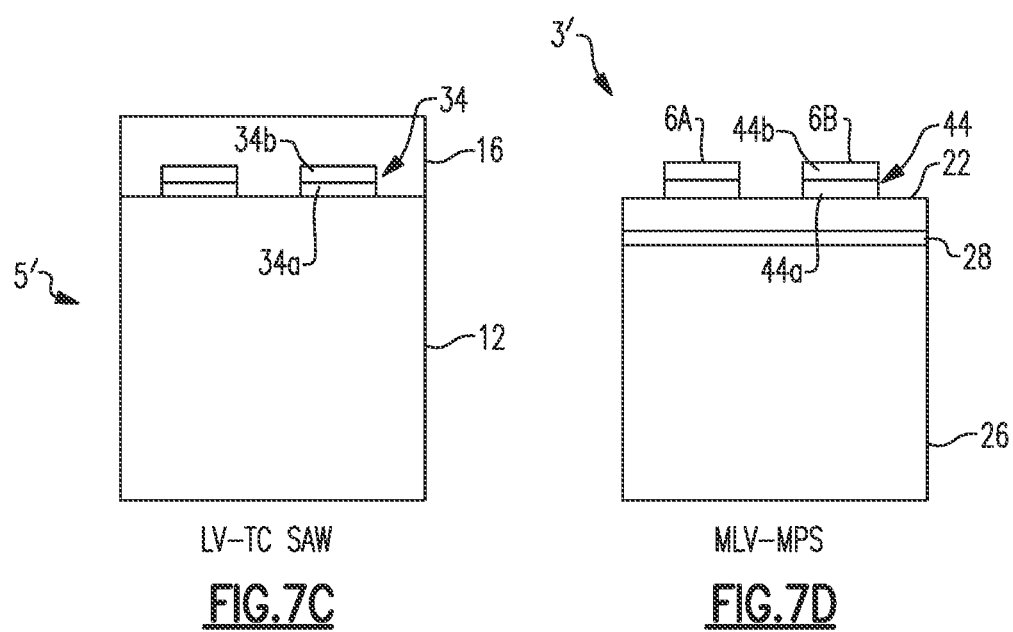

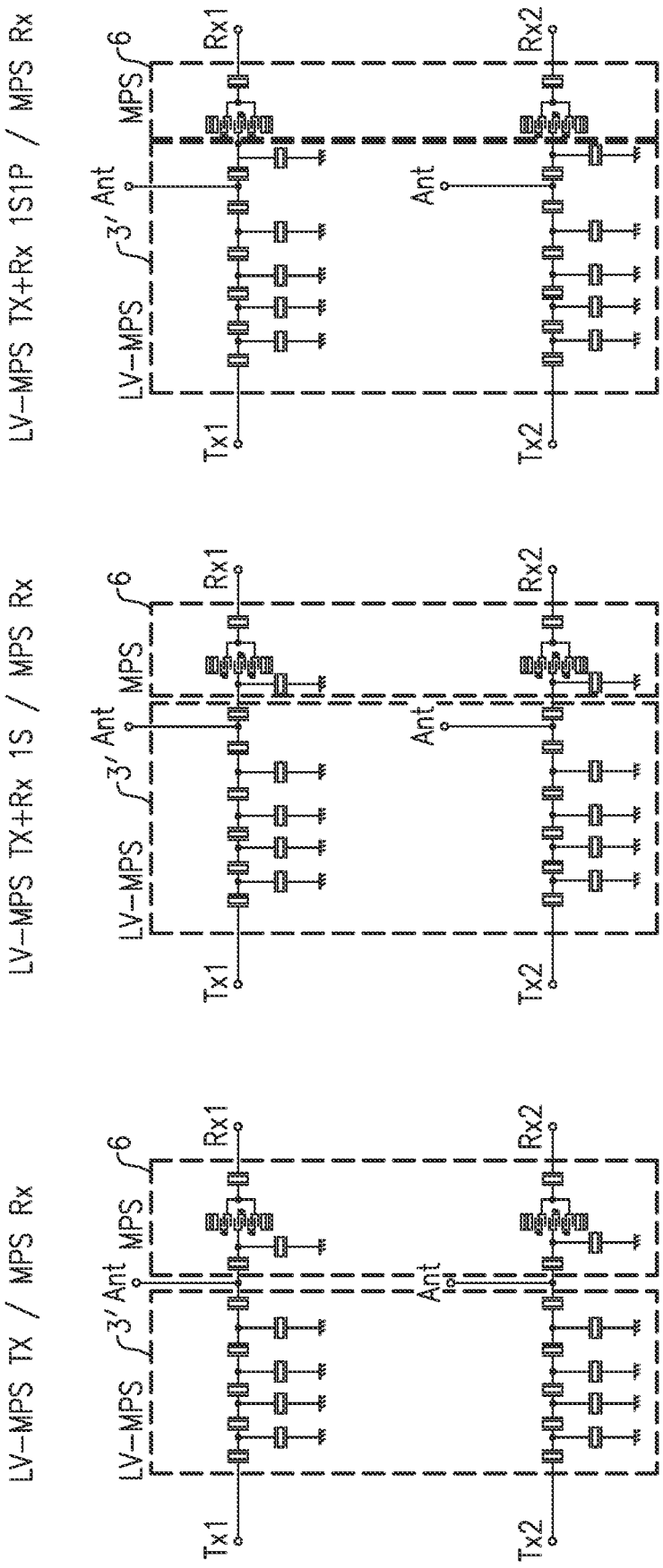

MULTIPLEXER FORMED ON MULTI-LAYER PIEZOELECTRIC SUBSTRATE AND TEMPERATURE COMPENSATED SURFACE ACOUSTIC WAVE DEVICE DIES

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 63/331,664, filed Apr. 15, 2022, titled "ACOUSTIC WAVE DEVICE," U.S. Provisional Patent Application No. 63/367,024, filed Jun. 24, 2022, titled "MULTIPLEXERS WITH DIFFERENT FILTER TYPES ON DIFFERENT DIES," U.S. Provisional Patent Application No. 63/367,018, filed Jun. 24, 2022, titled "MULTIPLEXER FORMED ON MULTI-LAYER PIEZOELECTRIC SUBSTRATE AND TEMPERATURE COMPENSATED SURFACE ACOUSTIC WAVE DIES," and U.S. Provisional Patent Application No. 63/367,020, filed Jun. 24, 2022, titled "MULTIPLEXER WITH DIES OF DIFFERENT ACOUSTIC VELOCITY," are hereby incorporated by reference under 37 CFR 1.57 in their entirety.

BACKGROUND

Technical Field

Embodiments of this disclosure relate to surface acoustic wave devices with two or more different type dies for two or more different type filters.

Description of Related Technology

Acoustic wave devices can be used as components of filters in radio frequency electronic systems. For instance, filters in a radio frequency front-end of a mobile phone can include acoustic wave filters. An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed. A multi-mode SAW filter, such as a double-mode SAW (DMS) filter, can include a plurality of longitudinally coupled interdigital transducer electrodes positioned between acoustic reflectors.

Surface acoustic wave filters operate by converting electrical energy into acoustic or mechanical energy on a piezoelectric material. The surface acoustic wave filters comprise interdigital transducer (IDT) electrodes which converts an electrical signal into an acoustic wave and then back to an electrical signal.

SUMMARY

The innovations described in the claims each have several aspects, no single one of which is solely responsible for its desirable attributes. Without limiting the scope of the claims, some prominent features of this disclosure will now be briefly described.

In one aspect, an acoustic wave device is disclosed. The acoustic wave device can include a first multiplexer having a first portion and a second portion, and a second multiplexer having a third portion and a fourth portion. The first portion and the third portion are formed in a first die. The second portion and the fourth portion are formed in a second die having a different physical structure from the first die.

In one embodiment, the first portion includes resonators of a transmission filter of the first multiplexer. The second portion can include resonators of a reception filter of the first multiplexer. The third portion can include resonators of a transmission filter of the second multiplexer. The fourth portion can include resonators of a reception filter of the second multiplexer. The first die can include a resonator of the reception filter of the first multiplexer. The second die can include a resonator of the transmission filter of the first multiplexer. The reception filter of the first multiplexer can include a multimode longitudinally coupled surface acoustic wave resonator. In one embodiment, the first die includes a multilayer piezoelectric substrate. The second die can be a temperature compensated surface acoustic wave die that includes a temperature compensation layer.

In one embodiment, the first die is configured such that an acoustic wave generated by the first die has a velocity greater than 3800 m/s.

In one embodiment, the second die is configured such that an acoustic wave generated by the second die has a velocity less than 3500 m/s.

In one embodiment, a velocity of an acoustic wave generated by the first die is at least 200 m/s greater than a velocity of an acoustic wave generated by the second die.

In one embodiment, a front end module includes the acoustic wave device and an antenna that is coupled to the acoustic wave device. A mobile device can include the front end module and a user interface.

In one aspect, an acoustic wave device is disclosed. The acoustic wave device can include a first die including a first transmission filter and a second transmission filter, and a second die including a first reception filter. The second die is different from the first die. The first transmission filter and the first reception filter are electrically connected defining a first multiplexer.

In one embodiment, the second die further includes a second reception filter. The second transmission filter and the second reception filter can be electrically connected defining a second multiplexer.

In one embodiment, the first die has a multilayer piezoelectric substrate. The second die can be a temperature compensated surface acoustic wave die that includes a temperature compensation layer.

In one embodiment, the first die is configured such that an acoustic wave generated by the first die has a velocity greater than 3800 m/s.

In one embodiment, a velocity of an acoustic wave generated by the first die is at least 200 m/s greater than a velocity of an acoustic wave generated by the second die.

In one aspect, a multiplexer is disclosed. The multiplexer can include a multilayer piezoelectric substrate surface acoustic wave device including at least a portion of a transmission filter, and a temperature compensated surface acoustic wave device including at least a portion of a reception filter. The reception filter is electrically connected to the transmission filter.

In one embodiment, the portion of the transmission filter includes a ladder filter.

In one embodiment, the portion of the reception filter includes a multimode longitudinally coupled surface acoustic wave resonator.

In one embodiment, the reception filter is electrically connected to the transmission filter at an antenna node.

In one embodiment, the multilayer piezoelectric substrate surface acoustic wave device further includes a series resonator of the reception filter. The multilayer piezoelectric substrate surface acoustic wave device can further include a shunt resonator of the reception filter.

In one embodiment, the temperature compensated surface acoustic wave device further includes a series resonator of the transmission filter. The temperature compensated surface acoustic wave device further includes a shunt resonator of the transmission filter.

In one embodiment, the multilayer piezoelectric substrate surface acoustic wave device is configured such that an acoustic wave generated by the multilayer piezoelectric substrate surface acoustic wave device has a velocity greater than 3800 m/s.

In one embodiment, the multilayer piezoelectric substrate surface acoustic wave device is configured such that an acoustic wave generated by the multilayer piezoelectric substrate surface acoustic wave device has a velocity less than 3800 m/s.

In one embodiment, the temperature compensated surface acoustic wave device is configured such that an acoustic wave generated by the temperature compensated surface acoustic wave device has a velocity greater than 3500 m/s.

In one embodiment, the temperature compensated surface acoustic wave device is configured such that an acoustic wave generated by the temperature compensated surface acoustic wave device has a velocity less than 3500 m/s.

In one embodiment, a difference between a velocity of an acoustic wave generated by the multilayer piezoelectric substrate surface acoustic wave device and a velocity of an acoustic wave generated by the temperature compensated surface acoustic wave device is at least 200 m/s.

In one embodiment, the multilayer piezoelectric substrate surface acoustic wave device includes a piezoelectric layer, an interdigital transducer electrode over the piezoelectric layer, a support substrate below the piezoelectric layer, and an intermediate layer between the piezoelectric layer and the support substrate. The interdigital transducer electrode of the multilayer piezoelectric substrate surface acoustic wave device can have a multilayer interdigital transducer electrode structure.

In one embodiment, the temperature compensated surface acoustic wave device includes a piezoelectric layer, an interdigital transducer electrode over the piezoelectric layer, and a temperature compensation layer over the interdigital transducer electrode, the temperature compensation layer includes silicon oxide. The interdigital transducer electrode of the temperature compensated surface acoustic wave device can have a multilayer interdigital transducer electrode structure.

In one aspect, a front end module is disclosed. The front end module can include a multiplexer including a multilayer piezoelectric substrate surface acoustic wave device having at least a portion of a transmission filter, and a temperature compensated surface acoustic wave device having at least a portion of a reception filter. The reception filter electrically is connected to the transmission filter. The front end module can include an antenna coupled to the multiplexer.

In one embodiment, the multilayer piezoelectric substrate surface acoustic wave device includes a piezoelectric layer, an interdigital transducer electrode over the piezoelectric layer, a support substrate below the piezoelectric layer, and an intermediate layer between the piezoelectric layer and the support substrate. The temperature compensated surface acoustic wave device can include a piezoelectric layer, an interdigital transducer electrode over the piezoelectric layer, and a temperature compensation layer over the interdigital transducer electrode. The temperature compensation layer can include silicon oxide. A difference between a velocity of an acoustic wave generated by the multilayer piezoelectric substrate surface acoustic wave device and a velocity of an acoustic wave generated by the temperature compensated surface acoustic wave device can be at least 200 m/s.

In one embodiment, a mobile device includes the front end module and a user interface.

In one aspect, an acoustic wave device is disclosed. The acoustic wave device can include a first multiplexer having a first portion and a second portion, and a second multiplexer having a third portion and a fourth portion. The first portion and the third portion are formed in a first die. The second portion and the fourth portion are formed in a second die. A difference between a velocity of an acoustic wave generated by the first die and a velocity of an acoustic wave generated by the second die is at least 200 m/s.

In one embodiment, the first portion includes resonators of a transmission filter of the first multiplexer. The second portion can include resonators of a reception filter of the first multiplexer. The third portion can include resonators of a transmission filter of the second multiplexer, and the fourth portion can include resonators of a reception filter of the second multiplexer. The first die can include a resonator of the reception filter of the first multiplexer. The second die can include a resonator of the transmission filter of the first multiplexer. The reception filter of the first multiplexer can include a multimode longitudinally coupled surface acoustic wave resonator.

In one embodiment, the first die includes a multilayer piezoelectric substrate. The second die can be a temperature compensated surface acoustic wave die that includes a temperature compensation layer.

In one embodiment, the first die is configured such that an acoustic wave generated by the first die has a velocity greater than 3800 m/s.

In one embodiment, the second die is configured such that an acoustic wave generated by the second die has a velocity less than 3500 m/s.

In one embodiment, a velocity of an acoustic wave generated by the first die is at least 200 m/s greater than a velocity of an acoustic wave generated by the second die.

In one embodiment, a front end module includes the acoustic wave device and an antenna coupled to the acoustic wave device. A mobile device can include the front end module and a user interface.

In one aspect, an acoustic wave device is disclosed. The acoustic wave device can include a first multiplexer having a first portion and a second portion, and a second multiplexer having a third portion and a fourth portion. The first portion and the third portion are formed in a first die. The second portion and the fourth portion are formed in a second die. A difference between a velocity of an acoustic wave generated by the first die and a velocity of an acoustic wave generated by the second die is at least 5% of the velocity of the acoustic wave generated by the first die.

In one embodiment, the first portion includes resonators of a transmission filter of the first multiplexer. The second portion can include resonators of a reception filter of the first multiplexer. The third portion can include resonators of a transmission filter of the second multiplexer. The fourth portion can include resonators of a reception filter of the second multiplexer. The reception filter of the first multiplexer can include a multimode longitudinally coupled surface acoustic wave resonator.

In one embodiment, the first die includes a multilayer piezoelectric substrate, and the second die is a temperature compensated surface acoustic wave die that includes a temperature compensation layer.

In one embodiment, the first die is configured such that an acoustic wave generated by the first die has a velocity greater than 3800 m/s.

In one embodiment, a velocity of an acoustic wave generated by the first die is at least 200 m/s greater than a velocity of an acoustic wave generated by the second die.

The present disclosure relates to U.S. patent application Ser. No. 18/190,369, titled "MULTIPLEXERS WITH DIFFERENT FILTER TYPES ON DIFFERENT DIES," and U.S. patent application Ser. No. 18/190,491, titled "MULTIPLEXER WITH DIES OF DIFFERENT ACOUSTIC VELOCITY," filed on even date herewith, the entire disclosures of which are hereby incorporated by reference herein.

BRIEF DESCRIPTION OF THE DRAWINGS

Embodiments of this disclosure will now be described, by way of non-limiting example, with reference to the accompanying drawings.

FIG. 1 is a schematic plan view of two duplexers.

FIG. 2 is a schematic plan view of two duplexers according to an embodiment.

FIG. 3 is a schematic plan view of two duplexers according to another embodiment.

FIGS. 7A to 7D are cross-sectional side views of acoustic wave devices according to various embodiments.

DETAILED DESCRIPTION OF CERTAIN EMBODIMENTS

Figure 4:
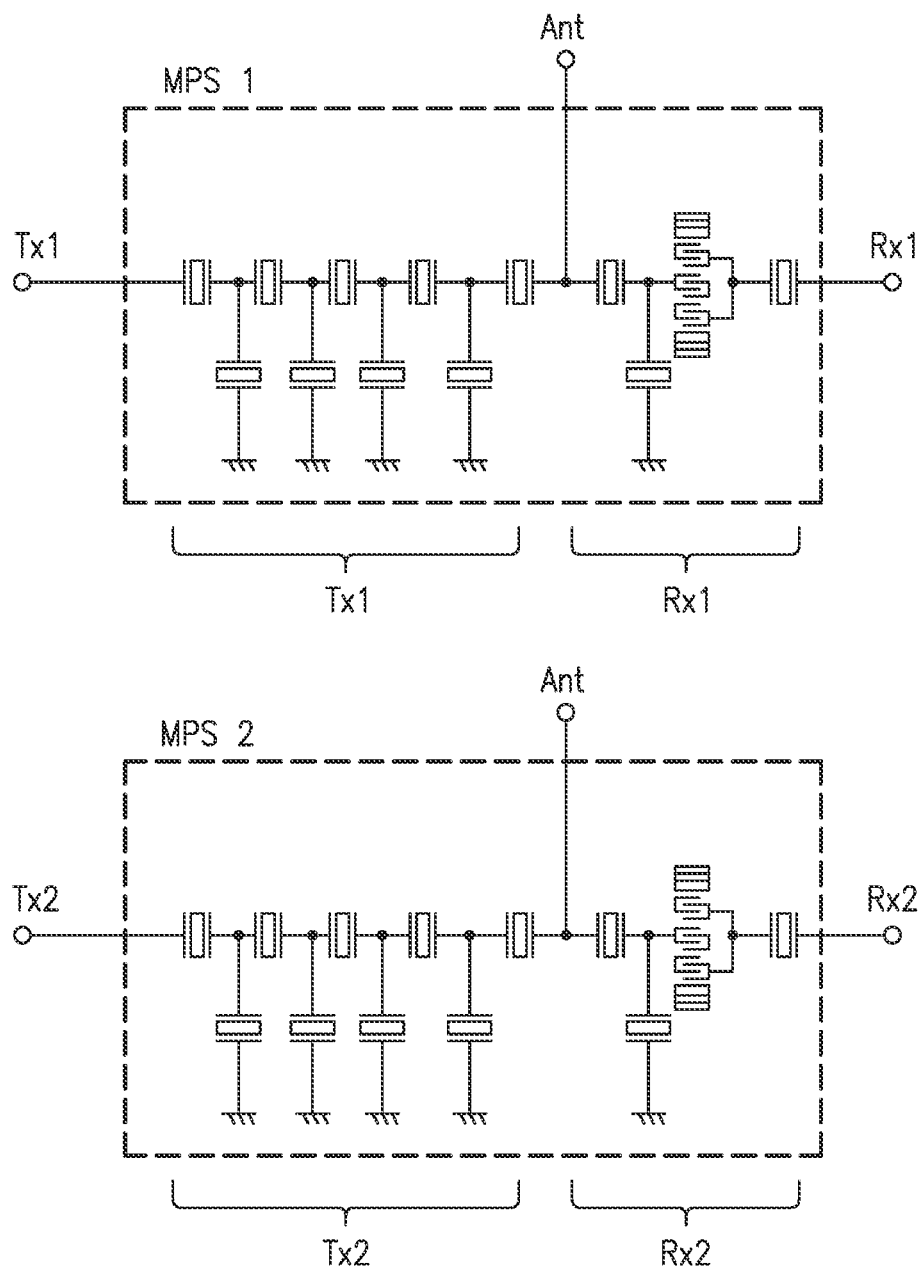
FIG. 4 is a circuit diagram of the two duplexers shown in FIG. 1.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Embodiments disclosed herein relate to acoustic wave devices for a multiplexer which can be used in a front-end module of a mobile device. Surface acoustic wave devices can be implemented in radio frequency electronic systems. For instance, filters in a radio frequency front end of a mobile phone can include surface acoustic wave devices such as surface acoustic wave filters. A surface acoustic wave filter can filter a radio frequency signal. A surface acoustic wave filter can be a band pass filter. A plurality of acoustic wave filters can be arranged as a multiplexer. For example, two acoustic wave filters (e.g., a transmission (Tx) filter and a reception (Rx) filter) can be arranged as a duplexer. In some embodiments, a duplexer can include one or more SAW resonators and/or one or more BAW resonators.

Although example embodiments may be discussed with filters or duplexers for illustrative purposes, any suitable principles and advantages disclosed herein can be implement in a multiplexer that includes a plurality of filters coupled together. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. One or more filters of a multiplexer can include a shunt acoustic wave resonator having multiple resonant frequencies. Multiplexers include multiplexers with fixed multiplexing and multiplexers with switched multiplexing.

Examples of a SAW device can include a temperature compensated surface acoustic wave (TC-SAW) device and a multi-layer piezoelectric substrate (MPS) SAW device. The MPS device can thermally insulate an interdigital transducer electrode and a piezoelectric layer. The MPS device can improve the ruggedness and power handling as compared to some other types of SAW devices such as the TC-SAW device. However, manufacturing the MPS device can be more cost prohibitive than some other types of SAW devices such as the TC-SAW device.

Various embodiments disclosed herein relate to utilizing different types of acoustic wave devices for forming multiplexers. In some embodiments, two separate dies with different acoustic wave device structures can define a single duplexer. For example, the duplexer can include a transmission (Tx) filter that includes a multilayer piezoelectric substrate (MPS) die and a reception (Rx) filter that includes a temperature compensated (TC-SAW) die that are electrically connected to define the duplexer. In some embodiments, a first type die with two or more first type filters and a second type die with one or more second type filters can be electrically coupled to define a multiplexer. The first type filter can be the Tx filter or the Rx filter and the second type filter can be Tx filter or the Rx filter different from the first type filter. The first type die can have a TC-SAW structure, an MPS structure, or a BAW structure, and the second type die can have a TC-SAW structure, an MPS structure, or a BAW structure different from the first type die. In some embodiments, the TC-SAW can be a low velocity TC-SAW, and the MPS SAW can be a low velocity MPS SAW.

FIG. 1 is a plan view of a conventional acoustic wave device. FIG. 1 shows two duplexers respectively formed in two separate dies. For RF front-end modules, filter size reduction of transmission and reception filters is desired. To achieve also a high power durability and low loss filter performance in a conventional acoustic wave device as illustrated in FIG. 1, MPS filter dies are used. FIG. 1 illustrates a module having two multilayer piezoelectric substrate (MPS) dies can each include a transmission (Tx) filter and a reception (Rx) filter. As can be seen from FIG. 1, there can be a size inefficiency due to inclusion of a rotated double-mode SAW (DMS) filter in the RX filters. Further, the Tx filters may call for a relatively high power durability.

FIG. 2 shows a schematic plan view of an acoustic wave device 1 according to an embodiment. The acoustic wave device 1 can include an MPS die 3 that has Tx filters (a first Tx filter 2-1 and a second Tx filter 2-2), and a TC-SAW die 5 that has Rx filters (a first Rx filter 4-1 and a second Rx filter 4-2). The first Tx filter 2-1 and the first Rx filter 4-1 can be electrically coupled in the acoustic wave device 1 to define a duplexer. The second Tx filter 2-2 and the second Rx filter 4-2 can be electrically coupled in the acoustic wave device 1 to define a duplexer. Accordingly, as compared to the two separately formed duplexers of FIG. 1, separating portions of a multiplexer, such as the duplexer, and combining the same or similar type filters of different multiplexers in a die as shown in FIG. 2 can be beneficially reduce the overall size of the acoustic wave device and/or reduce manufacturing cost of manufacturing the acoustic wave device 1.

The acoustic wave device 1 can include any suitable number of Tx filters and/or Rx filters. Each of the Tx filters and Rx filters included in the acoustic wave device 1 can include an acoustic wave resonator. As can be seen from the schematic diagram of FIG. 2, the combined area of dies 3, 5 of the acoustic wave device 1 can be significantly smaller than the size of the two MPS dies in a conventional setup as shown in FIG. 1. With the structure illustrated in FIG. 2, size inefficiency of a rotated DMS element of the RX filters can be avoided or reduced. Further, a high power durability on the Tx filters can be achieved or maintained. The resonators of a Tx filter disclosed herein may be illustrated to have a slanted structure. However, the resonators may not have a slanted structure in some embodiments.

FIG. 3 shows a schematic plan view of an acoustic wave device 1' according to another embodiment. Unless otherwise noted, components of the acoustic wave device 1' may be the same or generally similar to like components of any acoustic wave device disclosed herein, such as those shown in FIG. 2. The acoustic wave device 1' of FIG. 3 includes a low velocity MPS die 3' that has a first Tx filter 2'-1 and a second Tx filter 2'-2, and a TC-SAW die 5 that has a first Rx filter 4-1 and a second Rx filter 4-2.

In some embodiments, a standard MPS structure used in the MPS die 3 and a low velocity MPS structure used in the low velocity MPS die 3' can have different acoustic velocity. For example, the velocity of the wave generated in the standard MPS structure can be greater than 3800 m/s, and the velocity of the wave generated in the low velocity MPS structure can be equal to or lower than 3800 m/s. In some applications, a difference between the velocity of the wave generated in the standard MPS structure and the velocity of the wave generated in the low velocity MPS structure can be greater than 200 m/s. For example, the velocity of the wave generated in the standard MPS structure can be in a range of about 3800 m/s to 4000 m/s, and the velocity of the wave generated in the low velocity MPS structure can be in a range of about 3400 m/s to 3600 m/s. In some embodiments, a thickness of the interdigital transducer (IDT) electrode of the standard MPS structure and a thickness of the interdigital transducer (IDT) electrode of the low velocity MPS structure can contribute to the difference in the velocities of the standard MPS structure and the low velocity MPS structure. The structures of the MPS structures are described in more detail with respect to FIGS. 7B and 7D.

FIG. 4 shows a circuit diagram of the two MPS dies MPS1, MPS2 shown in FIG. 1. FIG. 4 shows that the Tx filter and the Rx filter of the MPS die MPS1 can be connected to a common antenna node ANT of a front-end module. In the same manner, the Tx filter and the Rx filter of the MPS die MPS2 can be connected to a common antenna node ANT.

Figure 5A:
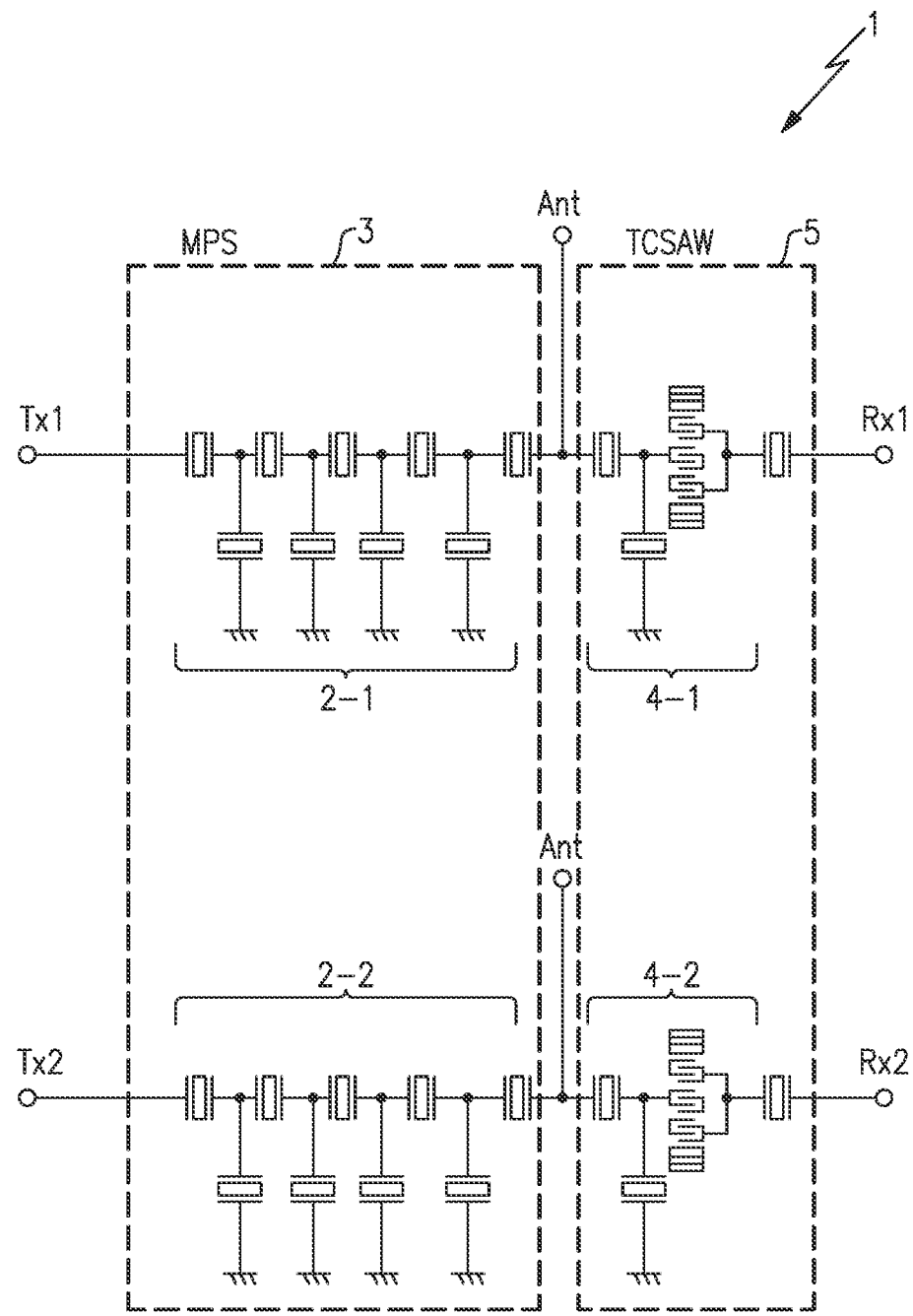
FIG. 5A is a circuit diagram of the two duplexers shown in FIG. 2.
Figure 5B:
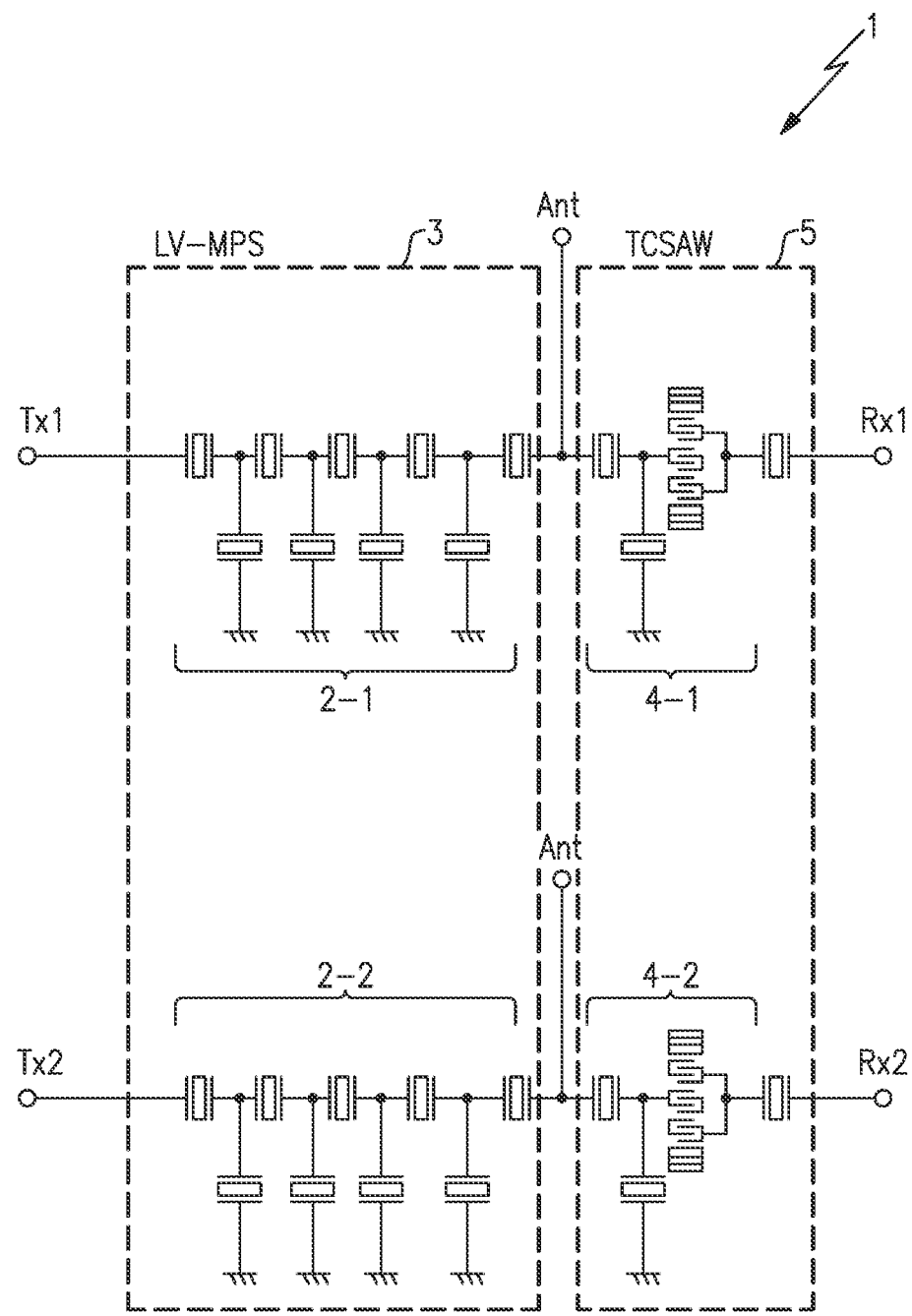
FIG. 5B is a circuit diagram of the two duplexers shown in FIG. 3.

FIG. 5A is a circuit diagram of the acoustic wave device 1 shown in FIG. 2. FIG. 5B is a circuit diagram of the acoustic wave device 1' shown in FIG. 3. Unless otherwise noted, components of FIGS. 5A and 5B may be the same or generally similar to like components of any acoustic wave device disclosed herein, such as those shown in FIGS. 2 and 3. In the acoustic wave device 1, the first Tx filter 2-1 and the second Tx filter 2-2 of the MPS die 3 are respectively connected to the first Rx filter 4-1 and the second Rx filter 4-2 of the TC-SAW die 5 to define a duplexer. Similarly, in the acoustic wave device 1', the first Tx filter 2'-1 and the second Tx filter 2'-2 of the MPS die 3' are respectively connected to the first Rx filter 4-1 and the second Rx filter 4-2 of the TC-SAW die 5 to define a duplexer.

Figure 6A:
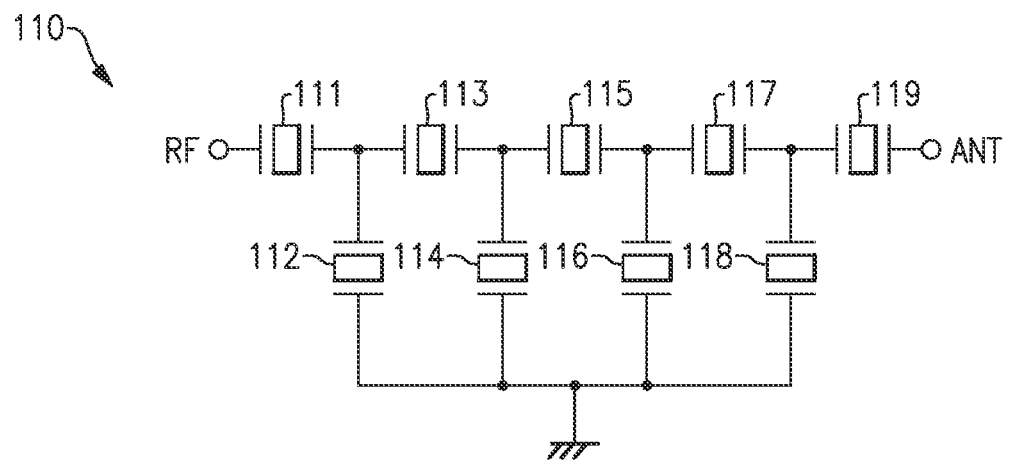
FIG. 6A is a schematic diagram of a ladder filter that includes a shunt resonator according to an embodiment.
Figure 6B:
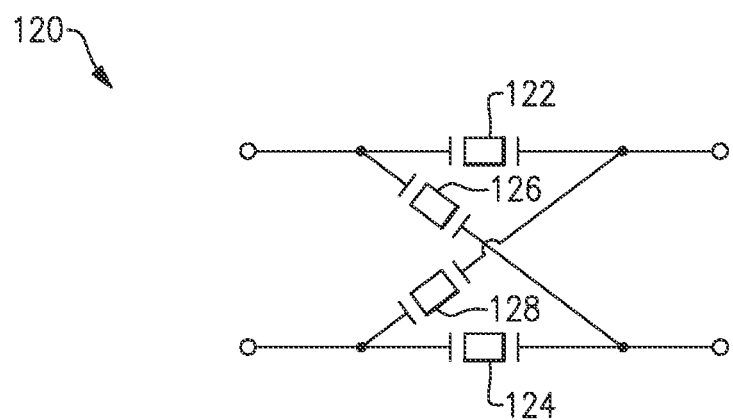
FIG. 6B is a schematic diagram of a lattice filter that includes a resonator.
Figure 6C:
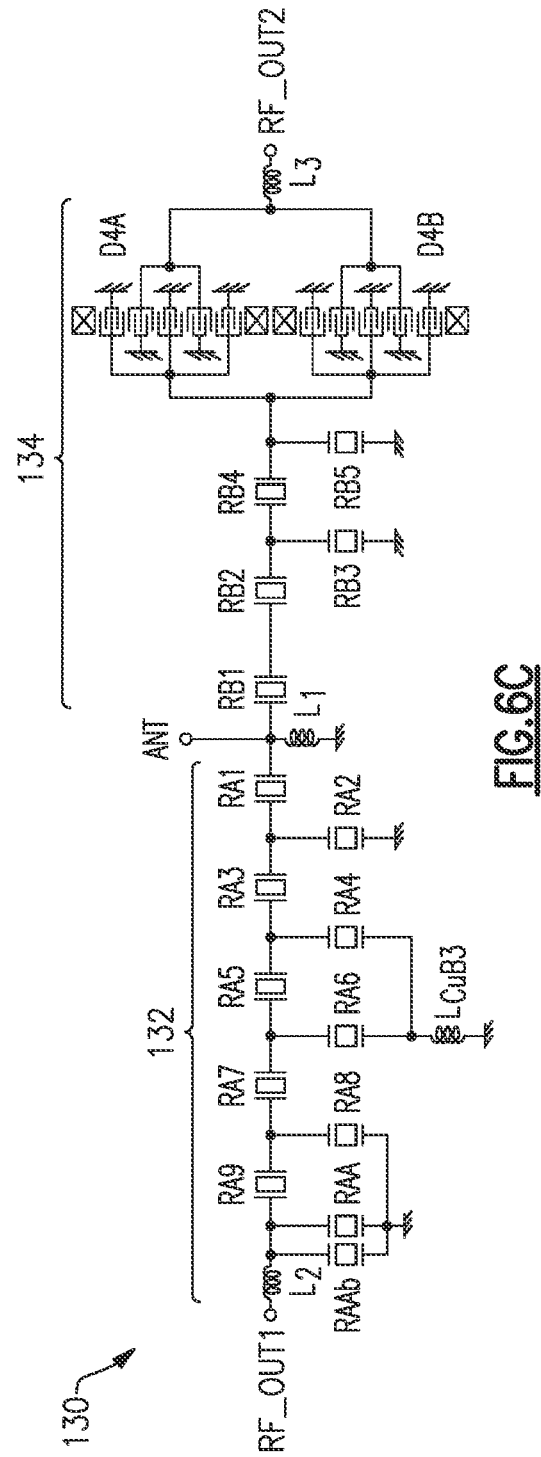
FIG. 6C is a schematic diagram of a duplexer according to an embodiment.

FIGS. 6A to 6C show various filter structures that can be used with acoustic wave devices disclosed herein. Acoustic wave filters disclosed herein can have a ladder filter topology. For example Tx filters disclosed herein can mainly be formed of a ladder filter. FIG. 6A is a schematic diagram of a ladder filter 110 that includes a shunt resonator according to an embodiment. The ladder filter 110 is an example topology of a band pass filter formed from acoustic wave resonators. In a band pass filter with a ladder filter topology, the shunt resonators can have lower resonant frequencies than the series resonators. The ladder filter 110 can be arranged to filter an RF signal. As illustrated, the ladder filter 110 includes series acoustic wave resonators 111, 113, 115, 117, and 119 and shunt acoustic wave resonators 112, 114, 116, and 118 coupled between an RF port RF and an antenna node ANT. The acoustic wave resonators of the ladder filter 110 can include any suitable acoustic wave resonators. The RF port can be a transmit port for a transmit filter or a receive port for a receive filter. Any suitable number of series acoustic wave resonators can be included in a ladder filter. Any suitable number of shunt acoustic wave resonators can be included in a ladder filter. Any of the illustrated shunt acoustic wave resonators 112, 114, 116, and 118 can have multiple resonant frequencies in accordance with any suitable principles and advantages disclosed herein. In certain instances, a single shunt resonator of the ladder filter 110 has multiple resonant frequencies in accordance with any suitable principles and advantages disclosed herein. In some other instances, two or more shunt resonators of the ladder filter 110 can have multiple resonant frequencies in accordance with any suitable principles and advantages disclosed herein.

In some embodiments, acoustic wave filters disclosed herein can have a lattice filter topology. FIG. 6B is a schematic diagram of a lattice filter 120 that includes a resonator. The lattice filter 120 is an example topology of a band pass filter formed from acoustic wave resonators. The lattice filter 120 can be arranged to filter an RF signal. As illustrated, the lattice filter 120 includes acoustic wave resonators 122, 124, 126, and 128. The acoustic wave resonators 122 and 124 are considered series resonators. The acoustic wave resonators 126 and 128 are considered shunt resonators. The illustrated lattice filter 120 has a balanced input and a balanced output. The illustrated acoustic wave resonators 126 and/or 128 can have multiple resonant frequencies in accordance with any suitable principles and advantages disclosed herein.

In some instances, an acoustic wave filter that includes a shunt resonator having two or more resonant frequencies can have a topology that is a hybrid of a ladder filter and a lattice filter. According to certain applications, an acoustic wave shunt resonator having two or more resonant frequencies can be included in filter that also includes one or more inductors and one or more capacitors.

FIG. 6C is a schematic diagram of a duplexer 130 that can implement advantages and principles disclosed herein. The duplexer 130 includes a first filter 132 and a second filter 134 coupled together at an antenna node ANT. At least a portion of the first filter 132 and at least a portion of the second filter 134 can be formed as separate dies in accordance with various embodiments disclosed herein. For example, a first type die can include the first filter 132 a second type die different from the first type die can include the second filter 134. In some embodiments, the first type die can also include a third filter that is the same as or similar to the first filter 132, and the second type die can also include a fourth filter that is the same as or similar to the second filter 134.

The antenna node ANT is a common node of the duplexer 130. A shunt inductor L1 is also coupled to the first filter 132 and the second filter 134 at the antenna node ANT. The duplexer 130 can be a diversity receive duplexer in which the first filter 132 is a receive filter and the second filter 134 is a receive filter. As an illustrative example, the first filter 132 can be a Band 3 receive filter and the second filter 134 can be a Band 66 receive filter.

The first filter 132 includes a plurality of acoustic wave resonators. As illustrated, the first filter 132 is a ladder filter. The acoustic wave resonators of the first filter 132 include series resonators RA1, RA3, RA5, RA7, and RA9 and shunt resonators RA2, RA4, RA6, RA8, RAA, and RAAb. One or more of the shunt resonators RA2, RA4, RA6, RA8, RAA, and RAAb can have a plurality of resonant frequencies. The first filter 132 also includes a series inductor L2 coupled between the plurality of acoustic wave resonators and an RF port RF_OUT1. The first filter 132 includes a shunt inductor LCuB3.

The second filter 134 includes a plurality of acoustic wave resonators. The acoustic wave resonators of the second filter 134 include series resonators RB1, RB2, and RB4, shunt resonators RB3 and RB5, and double mode SAW (DMS) elements D4A and D4B. The shunt resonator RB3 and/or the shunt resonator RB4 can have a plurality of resonant frequencies in accordance with any suitable principles and advantages disclosed herein in certain embodiments. The second filter 134 also includes a series inductor L3 coupled between the plurality of acoustic wave resonators and an RF port RF_OUT2.

FIGS. 7A, 7B, 7C, and 7D show schematic cross-sectional side views of acoustic wave devices that can be implemented in multiplexers disclosed herein. Unless otherwise noted, components of FIGS. 7A to 7D may be the same or generally similar to like components of any acoustic wave device disclosed herein, such as those shown in FIGS. 2, 3, and 5A-6C.

FIG. 7A illustrates a cross-sectional side view of at least a portion of the TC-SAW die 5 of the acoustic wave device 1 shown in FIG. 2. The TC-SAW die 5 includes a piezoelectric layer 12, an interdigital transducer (IDT) electrode 14 formed over the piezoelectric layer 12, and a temperature compensation layer 16.

The piezoelectric layer 12 can include any suitable piezoelectric layer, such as a lithium niobate (LN) layer or a lithium tantalate (LT) layer. For example, the LN layer can include $LiNbO_3$ and the LT layer can include $LiTaO_3$. A thickness of the piezoelectric layer 12 can be selected based on a wavelength $\lambda$ or L of a surface acoustic wave generated by the acoustic wave device 1.

The temperature compensation layer 16 is adapted to reduce a temperature frequency drift of the Tx filters of the acoustic wave device 1. The temperature compensation layer 16 of the TC-SAW die 5 can include F-doped silicon dioxide material or Ti-doped silicone dioxide material. The material can be applied for instance by way of chemical vapor deposition CVP or sputtering. The temperature compensation layer 16 can include any suitable temperature compensation material. For example, the temperature compensation layer 16 can be a silicon dioxide ($SiO_2$) layer. The temperature compensation layer 16 can be a layer of any other suitable material having a positive temperature coefficient of frequency for SAW resonators with a piezoelectric layer having a negative coefficient of frequency. For instance, the temperature compensation layer 16 can be a tellurium dioxide ($TeO_2$) layer or a silicon oxyfluoride (SiOF) layer in certain applications. The temperature compensation layer 16 can include any suitable combination of $SiO_2$, $TeO_2$, and/or SiOF.

The temperature compensation layer 16 being thicker can result in a temperature coefficient of frequency closer to zero and lower Q and electromechanical coupling coefficient ($k^2$). The temperature compensation layer 16 can be have different thicknesses such that certain resonators have a temperature coefficient of frequency closer to zero and other resonators have higher Q and $k^2$. The temperature compensation layer 16 of the TC-SAW die 5 can have a thickness in a range of 500 nm to 2000 nm. For example, the thickness of the temperature compensation layer 16 can be in a range between 500 nm and 1500 nm, 500 nm and 1000 nm, 750 nm and 2000 nm, 1000 nm and 2000 nm, or 1000 nm and 1500 nm.

The IDT electrode 14 can have a multilayer IDT structure that includes a first layer 14a and a second layer 14b. The first layer 14a and the second layer 14b of the IDT electrode 14 can include any suitable materials. For example, the first layer 14a and/or the second layer 14b of the IDT electrode 14 can include tungsten (W), aluminum (Al), copper (Cu), magnesium (Mg), titanium (Ti), molybdenum (Mo), the like, or any suitable combination thereof. The first layer 14a and/or the second layer 14b of the IDT electrode 14 may include alloys, such as AlMgCu, AlCu, etc. In some embodiments, the first layer 14a can be a Mo layer and the second layer 14b can be an Al layer. In some embodiments, the IDT electrode 14 can be replaced with a single layer IDT electrode that includes only one layer. In some other embodiments, the IDT electrode 14 can include additional layers, such as a third layer and/or a fourth layer.

FIG. 7B illustrates a cross-sectional side view of at least a portion of the MPS die 3 of the acoustic wave device 1 shown in FIG. 2. The MPS die 3 can include a piezoelectric layer 22, an IDT electrode 24 over the piezoelectric layer 22, a support substrate 26 below the piezoelectric layer 22, and an intermediate layer 28 between the piezoelectric layer 22 and the support substrate 26. The piezoelectric layer 22 of FIG. 7B can be the same as or generally similar to the piezoelectric layer 12 of FIG. 7A, and a first layer 24a and a second layer 24b of the IDT electrode 24 can be the same as or generally similar to the first layer 14a and the second layer 14b of the IDT electrode 14 respectively.

In some embodiments, the support substrate 26 and/or the intermediate layer 28 can act as a heat dissipation layer. The support substrate 26 can be a silicon substrate, a quartz substrate, a sapphire substrate, a polycrystalline spinel (e.g., $Mg_2O_4$ spinel) substrate, a ceramic substrate, a diamond substrate, a diamond like carbon substrate, aluminum nitrite substrate, or any other suitable carrier substrate. In some embodiments, the intermediate layer 28 can act as an adhesive layer. The intermediate layer 28 can include any suitable material. The intermediate layer 28 can be, for example, an oxide layer, such as a silicon dioxide ($SiO_2$) layer, a doped fluorine (F) layer, such as $SiO_2$ doped F layer, or a titanium layer.

FIG. 7C shows at least a portion of a cross-sectional side view of at least a portion of a low velocity TC-SAW die 5'. FIG. 7D shows a cross-sectional side view of the low velocity MPS die 3' shown in FIG. 3. The low velocity TC-SAW die 5' and the low velocity MPS die 3' can be used with any suitable acoustic wave devices disclosed herein. The low velocity TC-SAW die 5' can include a piezoelectric layer 12, an IDT layer 34 over the piezoelectric layer 12, and a temperature compensation layer 16 over the IDT layer 34. The IDT layer 34 can include a first layer 34a and a second layer 34b. The low velocity MPS die 3' can include a piezoelectric layer 22, an IDT layer 44 over the piezoelectric layer 22, a support substrate 26 below the piezoelectric layer 22, and an intermediate layer 28 between the piezoelectric layer 22 and the support substrate 26. The IDT layer 44 can include a first layer 44a and a second layer 44b.

A velocity of a propagating wave can be calculated by multiplying the frequency and the wave length. In some embodiments, a standard TCSAW structure used in the TC-SAW die 5 and a low velocity TC-SAW structure used in the low velocity TC-SAW die 5' can have different acoustic velocity. For example, the velocity of the wave generated in the standard TC-SAW structure can be greater than 3500 m/s, and the velocity of the wave generated in the low velocity TC-SAW structure can be equal to or lower than 3500 m/s. In some applications, a difference between the velocity of the wave generated in the standard TC-SAW structure and the velocity of the wave generated in the low velocity TC-SAW structure can be greater than 200 m/s. For example, the velocity of the wave generated in the standard TC-SAW structure can be in a range of about 3550 m/s to 3750 m/s, and the velocity of the wave generated in the low velocity MPS structure can be in a range of about 3300 m/s to 3500 m/s. For example, the velocity of the wave generated in the standard MPS structure can be greater than 3800 m/s, and the velocity of the wave generated in the low velocity MPS structure can be equal to or lower than 3800 m/s. In some applications, a difference between the velocity of the wave generated in the standard MPS structure and the velocity of the wave generated in the low velocity MPS structure can be greater than 200 m/s. For example, the velocity of the wave generated in the standard MPS structure can be in a range of about 3800 m/s to 4000 m/s, and the velocity of the wave generated in the low velocity MPS structure can be in a range of about 3400 m/s to 3600 m/s.

A thickness of the interdigital transducer (IDT) electrode of the standard TC-SAW structure and a thickness of the interdigital transducer (IDT) electrode of the low velocity MPS structure can contribute to the difference in the velocities of the standard TC-SAW structure and the low velocity TC-SAW structure. Similarly, a thickness of the interdigital transducer (IDT) electrode of the standard MPS structure and a thickness of the interdigital transducer (IDT) electrode of the low velocity MPS structure can contribute to the difference in the velocities of the standard MPS structure and the low velocity MPS structure. In some embodiments, the first layer 14a (e.g., a Mo layer) of the IDT electrode 14 of the TC-SAW die 5 and the first layer 24a (e.g., a Mo layer) of the IDT electrode 24 of the MPS die 3 can be greater than 0.06 L. In some embodiments, the first layer 34a (e.g., an Mo layer) of the IDT electrode 34 of the law velocity TC-SAW die 5' and the first layer 44a (e.g., a Mo layer) of the IDT electrode 44 of the low velocity MPS die 3' can be less than 0.06 L. In some embodiments, the first layer 14b (e.g., an Al layer) of the IDT electrode 14 of the TC-SAW die 5 and the first layer 24b (e.g., an Al layer) of the IDT electrode 24 of the MPS die 3 can be greater than 0.1 L. In some embodiments, the first layer 34b (e.g., an Al layer) of the IDT electrode 34 of the law velocity TC-SAW die 5' and the first layer 44b (e.g., an Al layer) of the IDT electrode 44 of the low velocity MPS die 3' can be less than 0.1 L.2

Figure 8A:
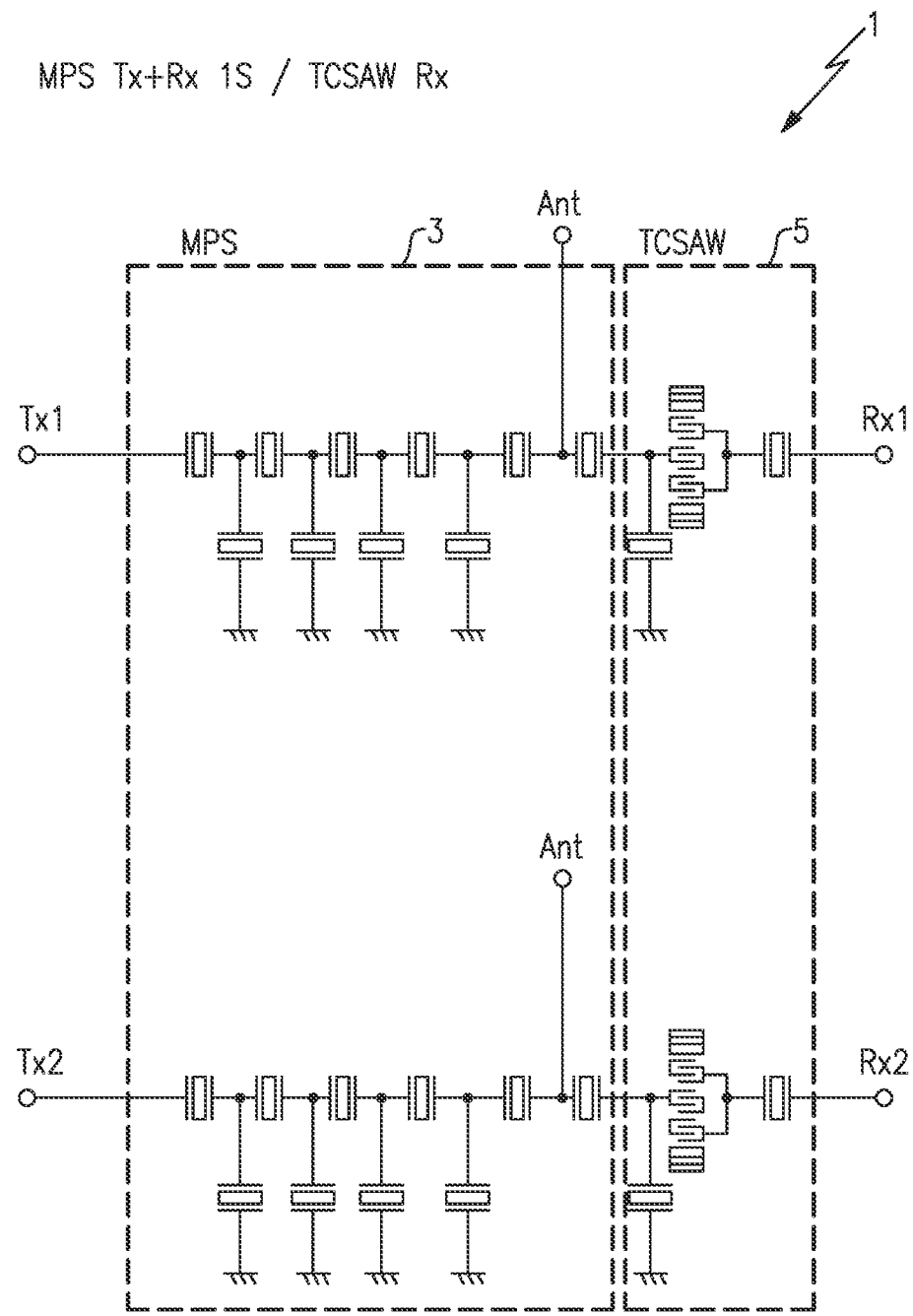
FIGS. 8A to 9G are circuit diagrams of duplexers according to various embodiments.
Figure 8B:
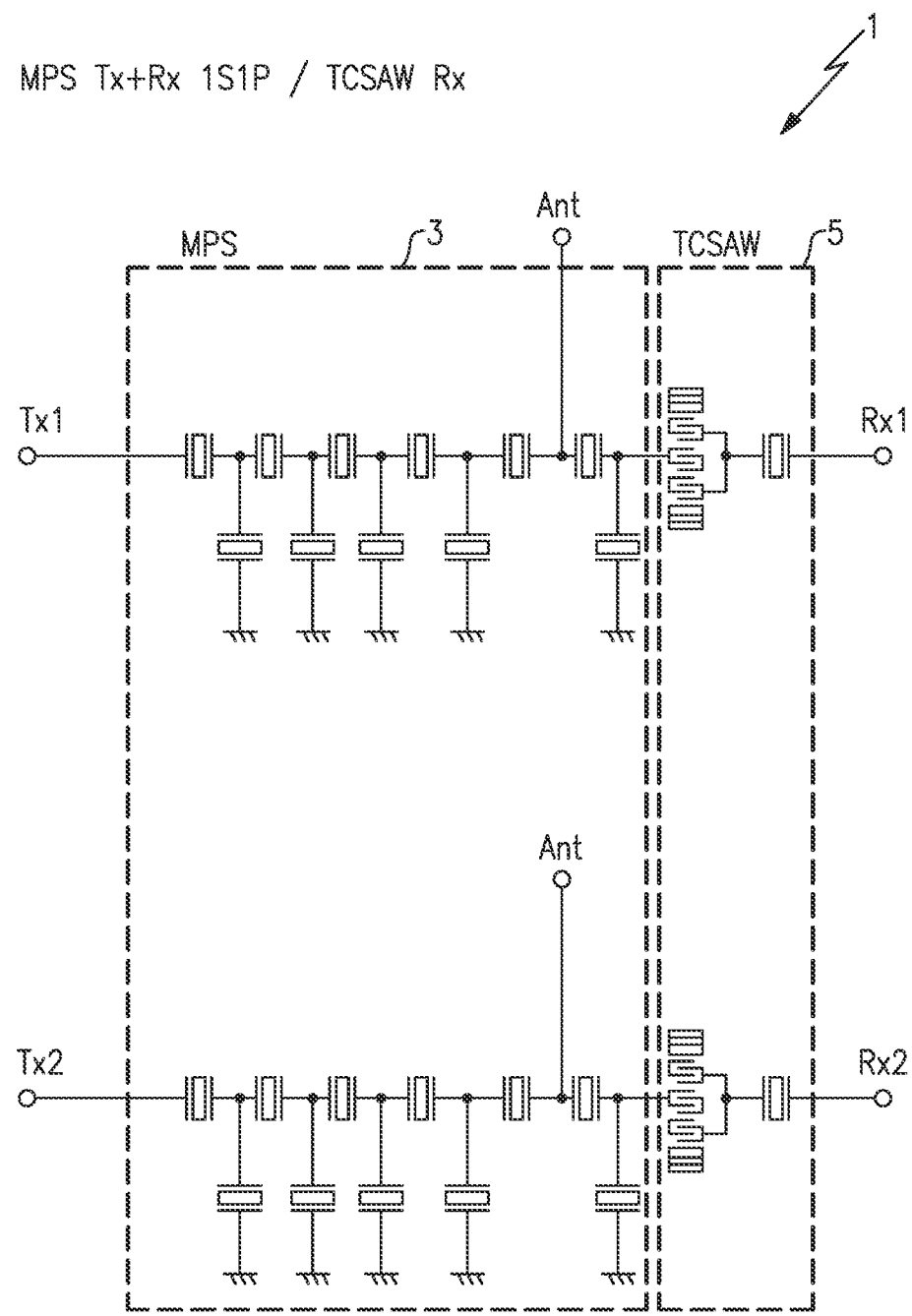

FIGS. 8A and 8B are circuit diagrams that can be implemented with any suitable acoustic wave devices disclosed herein, for example, the acoustic wave device 1 shown in FIG. 2. Though the acoustic wave device 1 that includes the MPS die 3 and the TC-SAW die 5 is used as an example, any suitable acoustic wave device that includes two different type dies can implement the advantages and principles disclosed herein.

As shown in FIGS. 8A and 8B at least a portion of the Rx filter can be formed with the MPS die 3. In FIG. 8A, series resonators of the Rx filters are formed with the MPS die 3. In FIG. 8B, series resonators and shunt resonators of the Rx filters are formed with the MPS die 3. In both FIGS. 8A and 8B, at least a DMS element of the Rx filter is formed with the TC-SAW 5.

FIGS. 9A to 9G are circuit diagrams that can be implemented with any suitable acoustic wave devices disclosed herein, for example, the acoustic wave device 1 shown in FIG. 2. Though the acoustic wave device 1 that includes the MPS die 3 and the TC-SAW die 5 is used as an example, any suitable acoustic wave device that includes two different type dies can implement the advantages and principles disclosed herein.

Figure 9A:
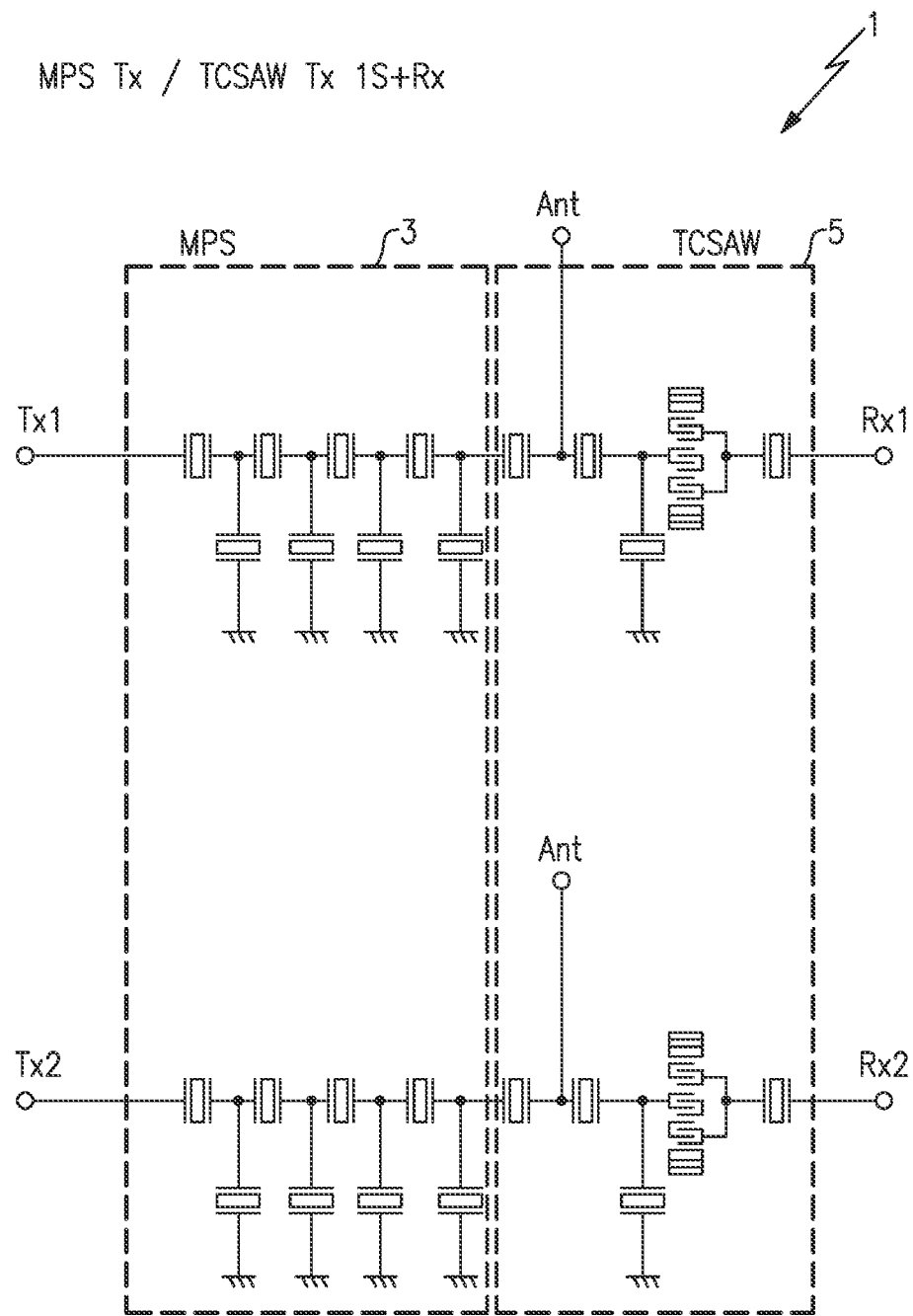
Figure 9B:
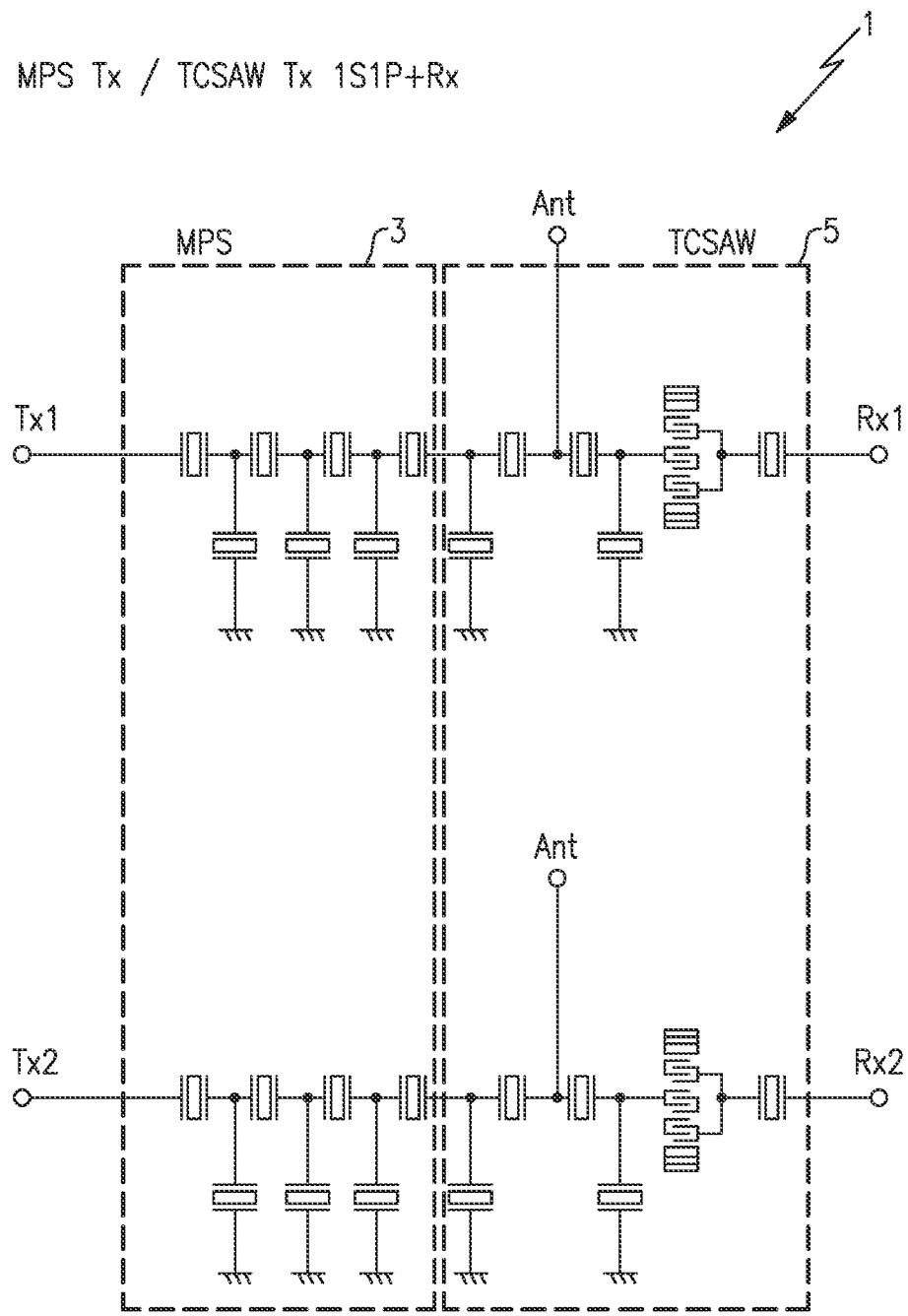

As shown in FIGS. 9A and 9B, at least a portion of the Tx filter can be formed with the TC-SAW die 5. In FIG. 9A, series resonators of the Tx filters are formed with the TC-SAW die 5. In FIG. 9B, series resonators and shunt resonators of the Tx filters are formed with the TC-SAW die 5.

FIGS. 9C-9G are circuit diagrams that can be implemented with any suitable acoustic wave devices disclosed herein. FIGS. 9C-9G show that the advantages and principles disclosed herein can be used with a combination of a low velocity MPS die 3' and an MPS die 6. FIG. 9C shows that the low velocity MPS die 3' can include Tx filters and the MPS die 6 can include Rx filters. Each of the Tx filters and corresponding one of the Rx filter of the Rx filters can be electrically connected at antenna nodes ANT to define multiplexers (e.g., duplexers).

FIGS. 9D and 9E show that at least a portion of the Rx filters can be formed with the low velocity MPS die 3'. FIG. 9D shows that series resonators of the Rx filters can be formed with the low velocity MPS die 3'. FIG. 9E shows that the series resonators and shunt resonators of the Rx filters can be formed with the low velocity MPS die 3'.

Figure 9F:
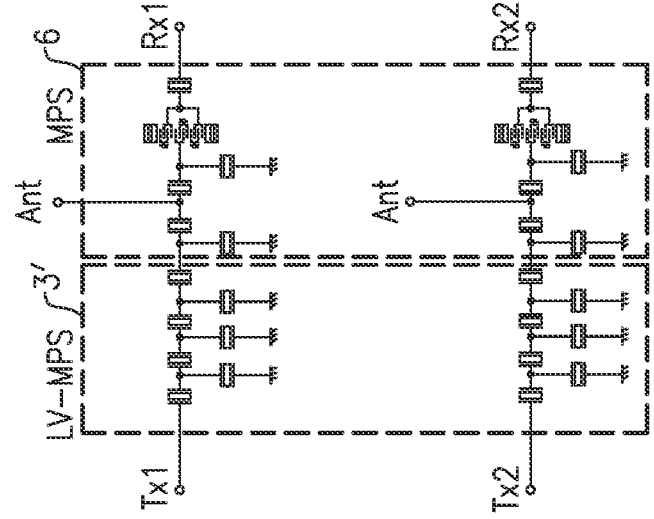
Figure 9G:
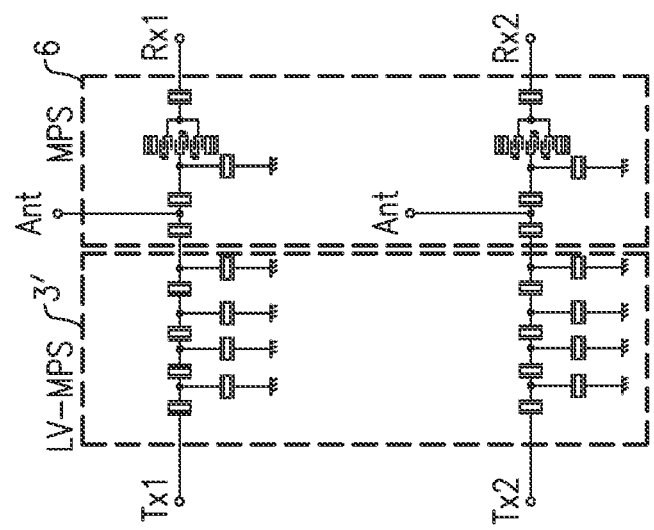

FIGS. 9F and 9G show that at least a portion of the Tx filters can be formed with the MPS die 6. FIG. 9D shows that series resonators of the Tx filters can be formed with the MPS die 6. FIG. 9E shows that the series resonators and shunt resonators of the Tx filters can be formed with the low velocity MPS die 6.

Various examples of multiplexers that implement the advantages and principles of the present disclosure are presented. A skilled artisan will understand that in accordance with any suitable principles and advantages disclosed herein, portions of a multiplexer can be formed on separate dies of different types. In some embodiments, the portions can include at least a portion of a Tx filter or at least a portion of an Rx filter. In some embodiments, the different types of dies can include a TC-SAW die, a low velocity TC-SAW die, an MPS die, a low velocity MPS die, or a BAW die. In some other embodiments, the different types of dies can include structurally different dies that are configured to generate waves with different velocities. The difference between the waves of different dies can be greater than 200 m/s, in some applications. In some applications, the benefits of using the TC-SAW die or the MPS die can be pronounced when resonators of the Rx filter is formed therewith. In some applications, the benefits of using the MPS die, a low velocity MPS die, or the BAW die can be pronounced when resonators of the Tx filter is formed therewith. In some embodiments, a plurality of multiplexers can be formed such that the same or similar type filters (e.g., Tx filters or Rx filters) can be formed with a particular type of die, and one or more of the rest of the filters of the multiplexers can be formed with a different type of die.

Figure 10:
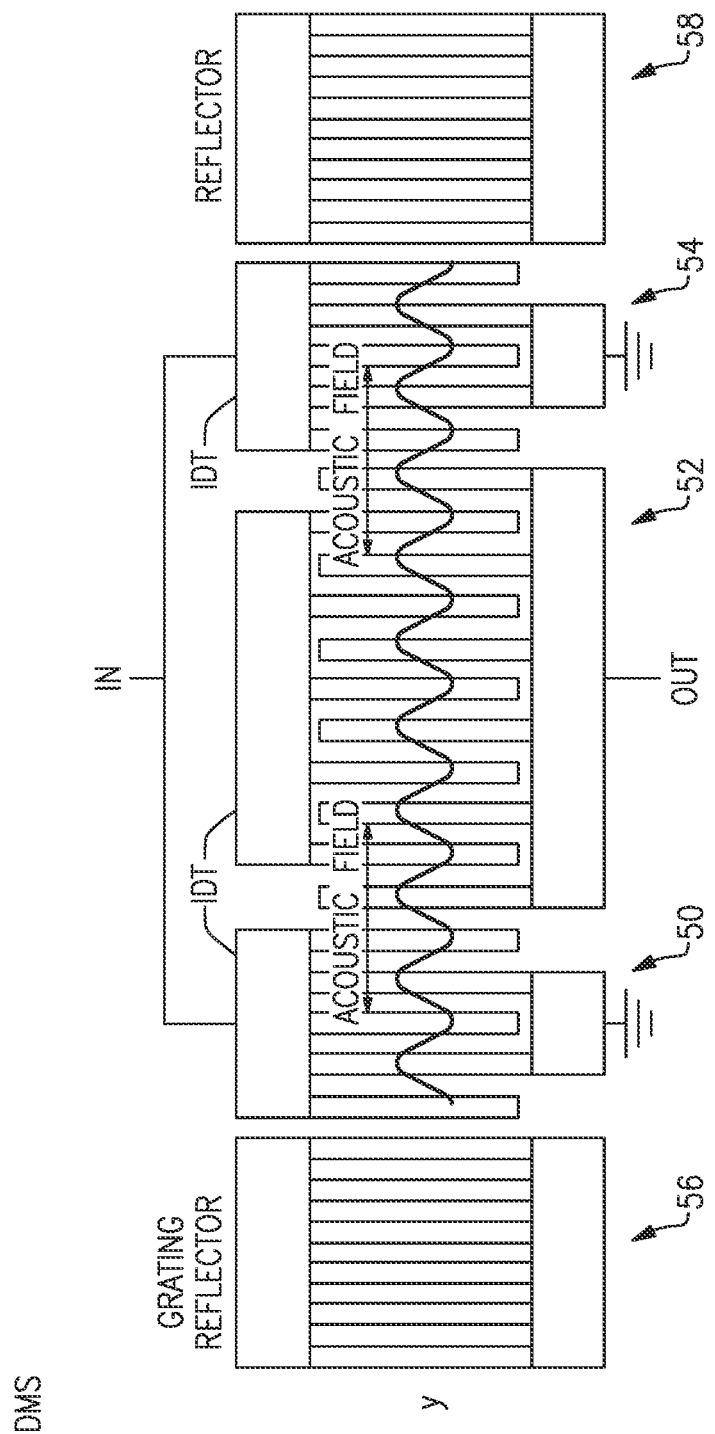
FIG. 10 is a schematic plan view of a double mode surface acoustic wave (DMS) device.

FIG. 10 illustrates a schematic plan view of a multimode longitudinally coupled SAW (MMS) resonator, which can be used in an acoustic wave device (e.g., the acoustic wave device 1) according to some embodiments. The MMS resonator illustrated in FIG. 10 can be a double mode SAW (DMS) filter. The MMS resonator illustrated in FIG. 10 can include a first IDT electrode 50, a second IDT electrode 52, a third IDT electrode 54, a first reflector 56, and a second reflector 58. The first to third IDT electrodes 50, 52, 54 can be positioned between the first and second reflectors 56, 58. The DMS filter can be implemented in an Rx filter.

The main acoustic wave of the MMS resonator illustrated in FIG. 10 travels perpendicular to the lengthwise direction of fingers of the IDT electrodes.

Figure 11:
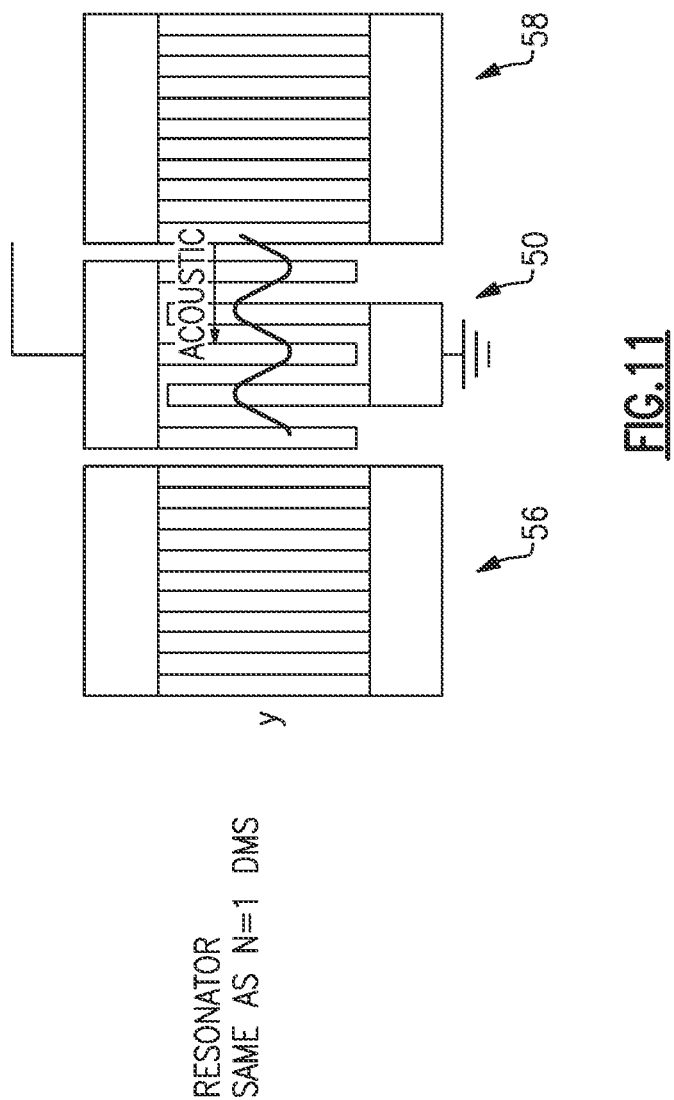
FIG. 11 is a schematic plan view of a surface acoustic wave resonator.

The reflectors 56, 58 can each include a first reflector busbar and a second reflector busbar and reflector fingers extending between an electrical coupling of the first busbar and the second busbar of the reflectors 56, 58 as shown in FIG. 10. The acoustic wave resonator illustrated in FIG. 11 comprises a single IDT electrode 50 positioned between the two reflectors 56, 58.

Figure 12:
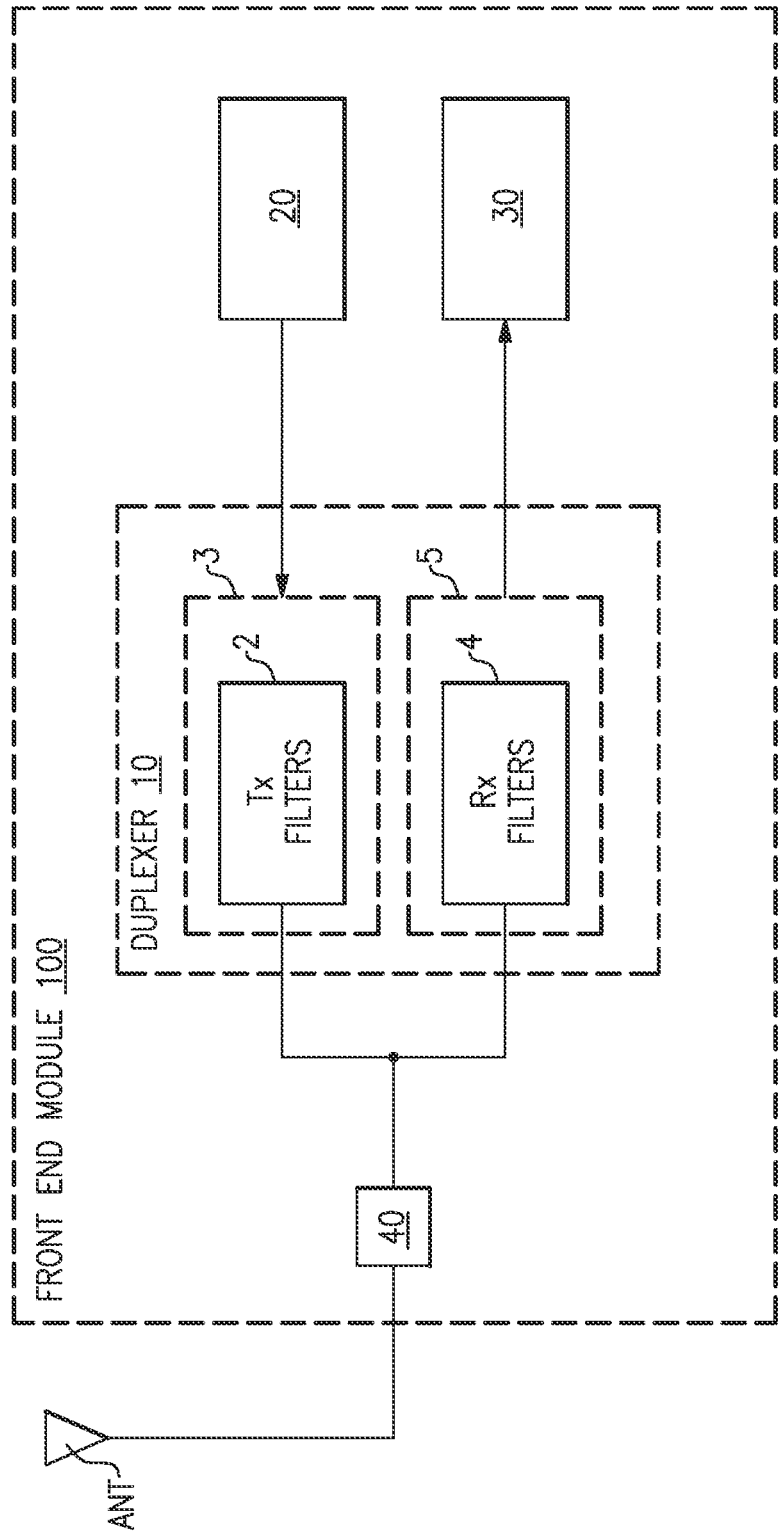
FIG. 12 shows a circuit diagram of a multiplexer used in a front-end module according to an embodiment.

FIG. 12 is a schematic block diagram of a front end module 100 that includes a duplexer 10 according to an embodiment. The duplexer 10 can include Tx filters 2 formed with a first type die (e.g., the MPS die 3) and Rx filters 4 formed with a second type die (e.g., the TC-SAW die 5). The front end module 100 can include an antenna matching component 40 between an antenna ANT and the duplexer 10, a transmitter circuit 20 that communicates with the Tx filters 2, and a receiver circuit 30 that communicates with the Rx filters 4.

Figure 13:
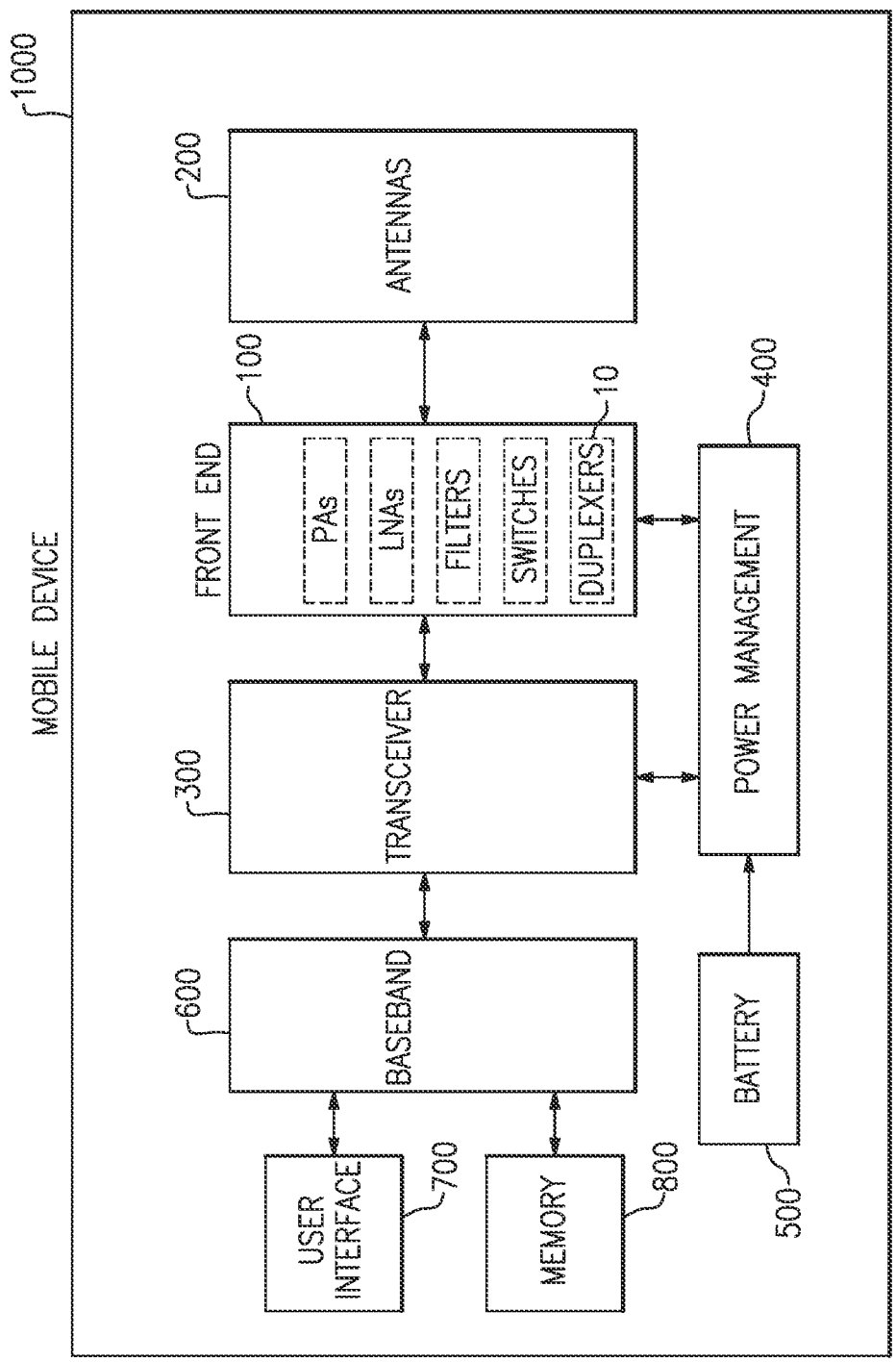
FIG. 13 shows a block diagram of a mobile device including acoustic wave devices according to an embodiment.

FIG. 13 is a schematic block diagram of a mobile device 1000 that can implement the front-end module 100 shown in FIG. 12. The front-end module 100 can be provided between one or more antennas 200 and a transceiver 300 as shown in FIG. 13. The front-end module 100 of the mobile device 1000 can include one or more acoustic wave devices of various embodiments disclosed herein forming filters or forming multiplexers 10 within the front-end module 100. The front-end module 100 can comprise other components such as power amplifiers (PAs), low-noise amplifiers (LNAs) and/or switches. In the illustrated embodiment, the mobile device 1000 includes a power management unit 400 receiving power supply from a battery 500. The transceiver 300 can be connected to a baseband unit 600 of the mobile device 1000. The mobile device 1000 further includes a user interface 700 and a memory 800 connected to the baseband unit 600 as shown in the block diagram of FIG. 13.

The acoustic wave devices disclosed herein allows reduction of size and weight of an electronic device such as the mobile device 1000 illustrated in FIG. 13. Any one of more of the acoustic wave devices disclosed herein can be used in wide range of applications, for instance for applications up 4 GHz, for instance in an operating frequency range between 600 MHz and 3.7 GHz. The dimension of the MPS transmission die 3 and the TC reception die 5 of the acoustic wave device 1 can be in longitudinal direction in a possible embodiment around 1000 μm. As schematically illustrated in the schematic diagrams of FIGS. 1 and 2 the structure of the acoustic wave device 1 shown in FIG. 2 allows a size reduction of more than 20% as compared to the conventional acoustic device illustrated schematically in FIG. 1.

An MMS filter and/or a SAW resonator including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more MPS SAW resonators disclosed herein. FR1 can be from 410 MHz to 7.125 GHz, for example, as specified in a current 5G NR specification. MMS filters disclosed herein can be implemented with less pitch variation than some previous MMS filters. MMS filters disclosed herein can filter higher frequency signals with the same IDT electrode line and space process limitations compared to some previous MMS filters. Filtering higher frequency signals can be advantageous in 5G applications. One or more MMS filters and/or SAW resonators in accordance with any suitable principles and advantages disclosed herein can be included in a filter arranged to filter a radio frequency signal in a fourth generation (4G) Long Term Evolution (LTE) operating band and/or in a filter having a passband that includes a 4G LTE operating band and a 5G NR operating band.

Although embodiments disclosed herein relate to surface acoustic wave filters and/or resonators, any suitable principles and advantages disclosed herein can be applied to other types of acoustic wave devices that include an IDT electrode, such as Lamb wave devices and/or boundary wave devices. For example, any suitable combination of features of the acoustic velocity adjustment structures disclosed herein can be applied to a Lamb wave device and/or a boundary wave device.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz. Acoustic wave resonators and/or filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. As used herein, the term "approximately" intends that the modified characteristic need not be absolute, but is close enough so as to achieve the advantages of the characteristic. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A multiplexer comprising:
a multilayer piezoelectric substrate surface acoustic wave device including at least a portion of a transmission filter and a series resonator of a reception filter; and
a temperature compensated surface acoustic wave device including at least a portion of the reception filter, the reception filter electrically connected to the transmission filter.

2. The multiplexer of claim 1 wherein the portion of the transmission filter includes a ladder filter.

3. The multiplexer of claim 1 wherein the portion of the reception filter includes a multimode longitudinally coupled surface acoustic wave resonator.

4. The multiplexer of claim 1 wherein the reception filter is electrically connected to the transmission filter at an antenna node.

5. The multiplexer of claim 1 wherein a die including the multilayer piezoelectric substrate surface acoustic wave device is 1000 um in a longitudinal direction.

6. The multiplexer of claim 1 wherein the multilayer piezoelectric substrate surface acoustic wave device further includes a shunt resonator of the reception filter.

7. The multiplexer of claim 1 wherein the temperature compensated surface acoustic wave device further includes a series resonator of the transmission filter.

8. The multiplexer of claim 7 wherein the temperature compensated surface acoustic wave device further includes a shunt resonator of the transmission filter.

9. The multiplexer of claim 1 wherein the multilayer piezoelectric substrate surface acoustic wave device is configured such that an acoustic wave generated by the multilayer piezoelectric substrate surface acoustic wave device has a velocity greater than 3800 m/s.

10. The multiplexer of claim 1 wherein the multilayer piezoelectric substrate surface acoustic wave device is configured such that an acoustic wave generated by the multilayer piezoelectric substrate surface acoustic wave device has a velocity less than 3800 m/s.

11. The multiplexer of claim 1 wherein the temperature compensated surface acoustic wave device is configured such that an acoustic wave generated by the temperature compensated surface acoustic wave device has a velocity greater than 3500 m/s.

12. The multiplexer of claim 1 wherein the temperature compensated surface acoustic wave device is configured such that an acoustic wave generated by the temperature compensated surface acoustic wave device has a velocity less than 3500 m/s.

13. The multiplexer of claim 1 wherein a difference between a velocity of an acoustic wave generated by the multilayer piezoelectric substrate surface acoustic wave device and a velocity of an acoustic wave generated by the temperature compensated surface acoustic wave device is at least 200 m/s.

14. The multiplexer of claim 1 wherein the multilayer piezoelectric substrate surface acoustic wave device includes a piezoelectric layer, an interdigital transducer electrode over the piezoelectric layer, a support substrate below the piezoelectric layer, and an intermediate layer between the piezoelectric layer and the support substrate.

15. The multiplexer of claim 14 wherein the interdigital transducer electrode of the multilayer piezoelectric substrate surface acoustic wave device has a multilayer interdigital transducer electrode structure.

16. The multiplexer of claim 1 wherein the temperature compensated surface acoustic wave device includes a piezoelectric layer, an interdigital transducer electrode over the piezoelectric layer, and a temperature compensation layer over the interdigital transducer electrode, the temperature compensation layer includes silicon oxide.

17. The multiplexer of claim 16 wherein the interdigital transducer electrode of the temperature compensated surface acoustic wave device has a multilayer interdigital transducer electrode structure.

18. A front end module comprising:
a multiplexer including a multilayer piezoelectric substrate surface acoustic wave device having at least a portion of a transmission filter and a series resonator of a reception filter, and a temperature compensated surface acoustic wave device having at least a portion of a reception filter, the reception filter electrically connected to the transmission filter; and
an antenna coupled to the multiplexer.

19. The front end module of claim 18 wherein:
the multilayer piezoelectric substrate surface acoustic wave device includes a piezoelectric layer, an interdigital transducer electrode over the piezoelectric layer, a support substrate below the piezoelectric layer, and an intermediate layer between the piezoelectric layer and the support substrate;
the temperature compensated surface acoustic wave device includes a piezoelectric layer, an interdigital transducer electrode over the piezoelectric layer, and a temperature compensation layer over the interdigital transducer electrode, the temperature compensation layer includes silicon oxide; and
a difference between a velocity of an acoustic wave generated by the multilayer piezoelectric substrate surface acoustic wave device and a velocity of an acoustic wave generated by the temperature compensated surface acoustic wave device is at least 200 m/s.

20. A mobile device including the front end module of claim 18 and a user interface.

* * * * *